United States Patent
Levy et al.

(10) Patent No.: US 10,896,973 B2
(45) Date of Patent: *Jan. 19, 2021

(54) OXIDE-NITRIDE-OXIDE STACK HAVING MULTIPLE OXYNITRIDE LAYERS

(71) Applicant: LONGITUDE FLASH MEMORY SOLUTIONS LTD., Dublin (IE)

(72) Inventors: Sagy Levy, Zichron Yaakov (IL); Krishnaswamy Ramkumar, San Jose, CA (US); Fredrick Jenne, Mountain House, CA (US); Sam Geha, Cupertino, CA (US)

(73) Assignee: LONGITUDE FLASH MEMORY SOLUTIONS LTD., Dublin (IE)

( * ) Notice: Subject to any disclaimer, the term of this patent is extended or adjusted under 35 U.S.C. 154(b) by 107 days.

This patent is subject to a terminal disclaimer.

(21) Appl. No.: 15/993,224

(22) Filed: May 30, 2018

(65) Prior Publication Data

US 2018/0366564 A1    Dec. 20, 2018

Related U.S. Application Data

(63) Continuation of application No. 15/189,668, filed on Jun. 22, 2016, which is a continuation of application
(Continued)

(51) Int. Cl.
*H01L 21/28* (2006.01)
*H01L 29/66* (2006.01)
(Continued)

(52) U.S. Cl.
CPC ........ *H01L 29/66833* (2013.01); *B82Y 10/00* (2013.01); *G11C 16/0466* (2013.01);
(Continued)

(58) Field of Classification Search
None
See application file for complete search history.

(56) References Cited

U.S. PATENT DOCUMENTS

| 4,257,832 A | 3/1981 | Schwabe et al. |
|---|---|---|
| 4,395,438 A | 7/1983 | Chiang |

(Continued)

FOREIGN PATENT DOCUMENTS

| CN | 1107254 A | 8/1995 |
|---|---|---|
| CN | 1801478 A | 7/2006 |

(Continued)

OTHER PUBLICATIONS

Chinese Office Action for Application No. 200880000820.3 dated Jan. 26, 2011; 6 pages.
(Continued)

*Primary Examiner* — Mohammad M Choudhry
(74) *Attorney, Agent, or Firm* — Kunzler Bean & Adamson

(57) ABSTRACT

An embodiment of a semiconductor memory device including a multi-layer charge storing layer and methods of forming the same are described. Generally, the device includes a channel formed from a semiconducting material overlying a surface on a substrate connecting a source and a drain of the memory device; a tunnel oxide layer overlying the channel; and a multi-layer charge storing layer including an oxygen-rich, first oxynitride layer on the tunnel oxide layer in which a stoichiometric composition of the first oxynitride layer results in it being substantially trap free, and an oxygen-lean, second oxynitride layer on the first oxynitride layer in which a stoichiometric composition of the second oxynitride layer results in it being trap dense. In one embodiment, the device comprises a non-planar transistor including a gate having multiple surfaces abutting the chan-
(Continued)

nel, and the gate comprises the tunnel oxide layer and the multi-layer charge storing layer.

20 Claims, 12 Drawing Sheets

Related U.S. Application Data

No. 13/436,872, filed on Mar. 31, 2012, now Pat. No. 9,449,831, which is a continuation-in-part of application No. 11/811,958, filed on Jun. 13, 2007, now abandoned.

(60) Provisional application No. 60/931,947, filed on May 25, 2007.

(51) Int. Cl.
```
G11C 16/04       (2006.01)
H01L 29/792      (2006.01)
B82Y 10/00       (2011.01)
H01L 29/423      (2006.01)
G11C 16/10       (2006.01)
G11C 16/14       (2006.01)
H01L 29/06       (2006.01)
H01L 29/78       (2006.01)
```

(52) U.S. Cl.
CPC .............. *G11C 16/10* (2013.01); *G11C 16/14* (2013.01); *H01L 29/0673* (2013.01); *H01L 29/0676* (2013.01); *H01L 29/40117* (2019.08); *H01L 29/4234* (2013.01); *H01L 29/42392* (2013.01); *H01L 29/66795* (2013.01); *H01L 29/792* (2013.01); *H01L 29/7926* (2013.01); *H01L 29/7833* (2013.01)

(56) References Cited

U.S. PATENT DOCUMENTS

| | | |
|---|---|---|
| 4,490,900 A | 1/1985 | Chiu |
| 4,543,707 A | 10/1985 | Ito et al. |
| 4,667,217 A | 5/1987 | Janning |
| 4,843,023 A | 6/1989 | Chiu et al. |
| 4,870,470 A | 9/1989 | Bass et al. |
| 5,179,038 A | 1/1993 | Kinney et al. |
| 5,348,903 A | 9/1994 | Pfiester et al. |
| 5,404,791 A | 4/1995 | Kervagoret |
| 5,405,791 A | 4/1995 | Ahmad et al. |
| 5,408,115 A | 4/1995 | Chang |
| 5,464,783 A | 11/1995 | Kim et al. |
| 5,500,816 A | 3/1996 | Kobayashi |
| 5,543,336 A | 8/1996 | Enami et al. |
| 5,550,078 A | 8/1996 | Sung |
| 5,573,963 A | 11/1996 | Sung |
| 5,773,343 A | 6/1998 | Lee et al. |
| 5,793,089 A | 8/1998 | Fulford et al. |
| 5,817,170 A | 10/1998 | Desu et al. |
| 5,847,411 A | 12/1998 | Morii |
| 5,861,347 A | 1/1999 | Maiti et al. |
| 5,937,323 A | 8/1999 | Orczyk et al. |
| 5,939,333 A | 8/1999 | Hurley et al. |
| 5,972,765 A | 10/1999 | Clark et al. |
| 5,972,804 A | 10/1999 | Tobin et al. |
| 6,001,713 A | 12/1999 | Ramsbey et al. |
| 6,015,739 A | 1/2000 | Gardner et al. |
| 6,020,606 A | 2/2000 | Liao |
| 6,023,093 A | 2/2000 | Gregor et al. |
| 6,025,267 A | 2/2000 | Pey et al. |
| 6,074,915 A | 6/2000 | Chen et al. |
| 6,114,734 A | 9/2000 | Eklund |
| 6,127,227 A | 10/2000 | Lin et al. |
| 6,136,654 A | 10/2000 | Kraft et al. |
| 6,140,187 A | 10/2000 | Debusk et al. |
| 6,147,014 A | 11/2000 | Lyding et al. |
| 6,150,286 A | 11/2000 | Sun et al. |
| 6,153,543 A | 11/2000 | Chesire et al. |
| 6,157,426 A | 12/2000 | Gu |
| 6,162,700 A | 12/2000 | Hwang et al. |
| 6,174,758 B1 | 1/2001 | Nachumovsky |
| 6,174,774 B1 | 1/2001 | Lee |
| 6,214,689 B1 | 4/2001 | Lim et al. |
| 6,217,658 B1 | 4/2001 | Orczyk et al. |
| 6,218,700 B1 | 4/2001 | Papadas |
| 6,268,299 B1 | 7/2001 | Jammy et al. |
| 6,277,683 B1 | 8/2001 | Pradeep et al. |
| 6,287,913 B1 | 9/2001 | Agnello et al. |
| 6,297,096 B1 | 10/2001 | Boaz |
| 6,297,173 B1 | 10/2001 | Tobin et al. |
| 6,321,134 B1 | 11/2001 | Henley et al. |
| 6,335,288 B1 | 1/2002 | Kwan et al. |
| 6,348,380 B1 | 2/2002 | Weimer et al. |
| 6,365,518 B1 | 4/2002 | Lee et al. |
| 6,399,484 B1 | 6/2002 | Yamasaki et al. |
| 6,406,960 B1 | 6/2002 | Hopper et al. |
| 6,429,081 B1 | 8/2002 | Doong et al. |
| 6,433,383 B1 | 8/2002 | Ramsbey et al. |
| 6,440,797 B1 | 8/2002 | Wu et al. |
| 6,444,521 B1 | 9/2002 | Chang et al. |
| 6,445,030 B1 | 9/2002 | Wu et al. |
| 6,461,899 B1 | 10/2002 | Kitakado et al. |
| 6,462,370 B2 | 10/2002 | Kuwazawa |
| 6,468,927 B1 | 10/2002 | Zhang et al. |
| 6,469,343 B1 | 10/2002 | Miura et al. |
| 6,518,113 B1 | 2/2003 | Buynoski |
| 6,559,026 B1 | 5/2003 | Rossman et al. |
| 6,573,149 B2 | 6/2003 | Kizilyalli et al. |
| 6,586,343 B1 | 7/2003 | Ho et al. |
| 6,586,349 B1 | 7/2003 | Jeon et al. |
| 6,596,590 B1 | 7/2003 | Miura et al. |
| 6,599,795 B2 | 7/2003 | Ogata |
| 6,602,771 B2 | 8/2003 | Inoue et al. |
| 6,610,614 B2 | 8/2003 | Niimi et al. |
| 6,624,090 B1 | 9/2003 | Yu et al. |
| 6,661,065 B2 | 12/2003 | Kunikiyo |
| 6,670,241 B1 | 12/2003 | Kamal et al. |
| 6,677,213 B1 | 1/2004 | Ramkumar et al. |
| 6,709,928 B1 | 3/2004 | Jenne et al. |
| 6,713,127 B2 | 3/2004 | Subramony et al. |
| 6,717,860 B1 | 4/2004 | Fujiwara |
| 6,730,566 B2 | 5/2004 | Niimi et al. |
| 6,746,968 B1 | 6/2004 | Tseng et al. |
| 6,768,160 B1 | 7/2004 | Li et al. |
| 6,768,856 B2 | 7/2004 | Akwani et al. |
| 6,774,433 B2 | 8/2004 | Lee et al. |
| 6,787,419 B2 | 9/2004 | Chen et al. |
| 6,818,558 B1 | 11/2004 | Rathor et al. |
| 6,833,582 B2 | 12/2004 | Mine et al. |
| 6,835,621 B2 | 12/2004 | Yoo et al. |
| 6,867,118 B2 | 3/2005 | Noro |
| 6,884,681 B1 | 4/2005 | Kamal et al. |
| 6,903,422 B2 | 6/2005 | Goda et al. |
| 6,906,390 B2 | 6/2005 | Nomoto et al. |
| 6,912,163 B2 | 6/2005 | Zheng et al. |
| 6,913,961 B2 | 7/2005 | Hwang |
| 6,917,072 B2 | 7/2005 | Noguchi et al. |
| 6,946,349 B1 | 9/2005 | Lee et al. |
| 6,958,511 B1 | 10/2005 | Halliyal et al. |
| 7,012,299 B2 | 3/2006 | Mahajani et al. |
| 7,015,100 B1 | 3/2006 | Lee et al. |
| 7,018,868 B1 | 3/2006 | Yang et al. |
| 7,033,890 B2 | 4/2006 | Shone |
| 7,033,957 B1 | 4/2006 | Shiraiwa et al. |
| 7,042,054 B1 | 5/2006 | Ramkumar et al. |
| 7,045,424 B2 | 5/2006 | Kim et al. |
| 7,060,594 B2 | 6/2006 | Wang |
| 7,084,032 B2 | 8/2006 | Crivelli et al. |
| 7,098,154 B2 | 8/2006 | Yoneda |
| 7,112,486 B2 | 9/2006 | Cho et al. |
| 7,115,469 B1 | 10/2006 | Halliyal et al. |
| 7,172,940 B1 | 2/2007 | Chen et al. |
| 7,189,606 B2 | 3/2007 | Wang et al. |
| 7,230,294 B2 | 6/2007 | Lee et al. |

(56) References Cited

U.S. PATENT DOCUMENTS

| | | |
|---|---|---|
| 7,238,990 B2 | 7/2007 | Burnett et al. |
| 7,250,654 B2 | 7/2007 | Chen et al. |
| 7,253,046 B2 | 8/2007 | Higashi et al. |
| 7,262,457 B2 | 8/2007 | Hsu et al. |
| 7,279,740 B2 | 10/2007 | Bhattacharyya et al. |
| 7,301,185 B2 | 11/2007 | Chen et al. |
| 7,312,496 B2 | 12/2007 | Hazama |
| 7,315,474 B2 | 1/2008 | Lue |
| 7,323,742 B2 | 1/2008 | Georgescu |
| 7,338,869 B2 | 3/2008 | Fukada et al. |
| 7,365,389 B1 | 4/2008 | Jeon et al. |
| 7,372,113 B2 | 5/2008 | Tanaka et al. |
| 7,390,718 B2 | 6/2008 | Roizin et al. |
| 7,410,857 B2 | 8/2008 | Higashi et al. |
| 7,425,491 B2 | 9/2008 | Forbes |
| 7,450,423 B2 | 11/2008 | Lai et al. |
| 7,463,530 B2 | 12/2008 | Lue et al. |
| 7,479,425 B2 | 1/2009 | Ang et al. |
| 7,482,236 B2 | 1/2009 | Lee et al. |
| 7,521,751 B2 | 4/2009 | Fujiwara |
| 7,535,053 B2 | 5/2009 | Yamazaki |
| 7,544,565 B2 | 6/2009 | Kwak et al. |
| 7,576,386 B2 | 8/2009 | Lue et al. |
| 7,588,986 B2 | 9/2009 | Jung |
| 7,601,576 B2 | 10/2009 | Suzuki et al. |
| 7,612,403 B2 | 11/2009 | Bhattacharyya |
| 7,636,257 B2 | 12/2009 | Lue |
| 7,642,585 B2 | 1/2010 | Wang et al. |
| 7,646,041 B2 | 1/2010 | Chae et al. |
| 7,646,637 B2 | 1/2010 | Liao |
| 7,670,963 B2 | 3/2010 | Ramkumar et al. |
| 7,688,626 B2 | 3/2010 | Lue et al. |
| 7,692,246 B2 | 4/2010 | Dreeskornfeld et al. |
| 7,713,810 B2 | 5/2010 | Hagemeyer et al. |
| 7,714,379 B2 | 5/2010 | Lee |
| 7,723,789 B2 | 5/2010 | Lin et al. |
| 7,737,488 B2 | 6/2010 | Lai et al. |
| 7,790,516 B2 | 9/2010 | Willer et al. |
| 7,811,890 B2 | 10/2010 | Hsu et al. |
| 7,879,738 B2 | 2/2011 | Wang |
| 7,910,429 B2 | 3/2011 | Dong et al. |
| 7,927,951 B2 | 4/2011 | Kim et al. |
| 7,948,799 B2 | 5/2011 | Lue et al. |
| 7,972,930 B2 | 7/2011 | Jang et al. |
| 7,999,295 B2 | 8/2011 | Lai et al. |
| 8,008,713 B2 | 8/2011 | Dobuzinsky et al. |
| 8,063,434 B1 | 11/2011 | Polishchuk et al. |
| 8,067,284 B1 | 11/2011 | Levy |
| 8,071,453 B1 | 12/2011 | Ramkumar et al. |
| 8,093,128 B2 | 1/2012 | Koutny et al. |
| 8,143,129 B2 | 3/2012 | Ramkumar et al. |
| 8,163,660 B2 | 4/2012 | Puchner et al. |
| 8,222,688 B1 | 7/2012 | Jenne et al. |
| 8,264,028 B2 | 9/2012 | Lue et al. |
| 8,283,261 B2 | 10/2012 | Ramkumar |
| 8,315,095 B2 | 11/2012 | Lue et al. |
| 8,318,608 B2 | 11/2012 | Ramkumar et al. |
| 8,482,052 B2 | 7/2013 | Lue et al. |
| 8,633,537 B2 | 1/2014 | Polishchuk et al. |
| 8,643,124 B2 * | 2/2014 | Levy .................. C23C 16/0272 257/411 |
| 8,710,578 B2 | 4/2014 | Jenne et al. |
| 8,859,374 B1 | 10/2014 | Polishchuk et al. |
| 8,860,122 B1 | 10/2014 | Polishchuk et al. |
| 8,940,645 B2 | 1/2015 | Ramkumar et al. |
| 8,993,453 B1 | 3/2015 | Ramkumar et al. |
| 9,093,318 B2 | 7/2015 | Polishchuk et al. |
| 9,306,025 B2 | 4/2016 | Polishchuk et al. |
| 9,349,824 B2 | 5/2016 | Levy et al. |
| 9,355,849 B1 | 5/2016 | Levy et al. |
| 9,449,831 B2 | 9/2016 | Levy et al. |
| 9,502,543 B1 | 11/2016 | Polishchuk et al. |
| 9,929,240 B2 | 3/2018 | Polishchuk et al. |
| 2001/0052615 A1 | 12/2001 | Fujiwara |
| 2002/0020890 A1 | 2/2002 | Willer |
| 2002/0048200 A1 | 4/2002 | Kuwazawa |
| 2002/0048893 A1 | 4/2002 | Kizilyalli et al. |
| 2002/0109138 A1 | 8/2002 | Forbes |
| 2002/0141237 A1 | 10/2002 | Goda et al. |
| 2002/0154878 A1 | 10/2002 | Akwani et al. |
| 2003/0030100 A1 | 2/2003 | Lee et al. |
| 2003/0122204 A1 | 7/2003 | Nomoto et al. |
| 2003/0123307 A1 | 7/2003 | Lee et al. |
| 2003/0124873 A1 | 7/2003 | Xing et al. |
| 2003/0169629 A1 | 9/2003 | Goebel et al. |
| 2003/0183869 A1 | 10/2003 | Crivelli et al. |
| 2003/0222293 A1 | 12/2003 | Noro |
| 2003/0227049 A1 | 12/2003 | Sakakibara |
| 2003/0227056 A1 | 12/2003 | Wang et al. |
| 2004/0067619 A1 | 4/2004 | Niimi et al. |
| 2004/0071030 A1 | 4/2004 | Goda et al. |
| 2004/0094793 A1 | 5/2004 | Noguchi et al. |
| 2004/0104424 A1 | 6/2004 | Yamazaki |
| 2004/0129986 A1 | 7/2004 | Kobayashi et al. |
| 2004/0129988 A1 | 7/2004 | Rotondaro et al. |
| 2004/0173918 A1 | 9/2004 | Kamal et al. |
| 2004/0183091 A1 | 9/2004 | Hibino |
| 2004/0183122 A1 | 9/2004 | Mine et al. |
| 2004/0207002 A1 | 10/2004 | Ryu et al. |
| 2004/0227196 A1 | 11/2004 | Yoneda |
| 2004/0227198 A1 | 11/2004 | Mitani et al. |
| 2004/0251489 A1 | 12/2004 | Jeon et al. |
| 2005/0026637 A1 | 2/2005 | Fischer et al. |
| 2005/0056892 A1 | 3/2005 | Seliskar |
| 2005/0062098 A1 | 3/2005 | Mahajani et al. |
| 2005/0070126 A1 | 3/2005 | Senzaki |
| 2005/0079659 A1 | 4/2005 | Duan et al. |
| 2005/0088889 A1 | 4/2005 | Lee et al. |
| 2005/0093054 A1 | 5/2005 | Jung |
| 2005/0098839 A1 | 5/2005 | Lee et al. |
| 2005/0110064 A1 | 5/2005 | Duan et al. |
| 2005/0116279 A1 | 6/2005 | Koh |
| 2005/0141168 A1 | 6/2005 | Lee et al. |
| 2005/0186741 A1 | 8/2005 | Roizin et al. |
| 2005/0205920 A1 | 9/2005 | Jeon et al. |
| 2005/0224866 A1 | 10/2005 | Higashi et al. |
| 2005/0227501 A1 | 10/2005 | Tanabe et al. |
| 2005/0230766 A1 | 10/2005 | Nomoto et al. |
| 2005/0236679 A1 | 10/2005 | Hori et al. |
| 2005/0245034 A1 | 11/2005 | Fukuda et al. |
| 2005/0266637 A1 | 12/2005 | Wang |
| 2005/0275010 A1 | 12/2005 | Chen et al. |
| 2005/0275012 A1 | 12/2005 | Nara et al. |
| 2006/0008959 A1 | 1/2006 | Hagemeyer et al. |
| 2006/0017092 A1 | 1/2006 | Dong et al. |
| 2006/0022252 A1 | 2/2006 | Doh et al. |
| 2006/0051880 A1 | 3/2006 | Doczy et al. |
| 2006/0065919 A1 | 3/2006 | Fujiwara |
| 2006/0081331 A1 | 4/2006 | Campian |
| 2006/0111805 A1 | 5/2006 | Yokoyama et al. |
| 2006/0113586 A1 | 6/2006 | Wang |
| 2006/0113627 A1 | 6/2006 | Chen et al. |
| 2006/0131636 A1 | 6/2006 | Jeon et al. |
| 2006/0160303 A1 | 7/2006 | Ang et al. |
| 2006/0192248 A1 | 8/2006 | Wang |
| 2006/0202261 A1 | 9/2006 | Lue et al. |
| 2006/0202263 A1 | 9/2006 | Lee |
| 2006/0220106 A1 | 10/2006 | Choi et al. |
| 2006/0226490 A1 | 10/2006 | Burnett et al. |
| 2006/0228841 A1 | 10/2006 | Kim et al. |
| 2006/0228899 A1 | 10/2006 | Nansei et al. |
| 2006/0228907 A1 | 10/2006 | Cheng et al. |
| 2006/0237803 A1 | 10/2006 | Zhu et al. |
| 2006/0261401 A1 | 11/2006 | Bhattacharyya |
| 2006/0281331 A1 | 12/2006 | Wang |
| 2006/0284236 A1 | 12/2006 | Bhattacharyya |
| 2007/0012988 A1 | 1/2007 | Bhattacharyya |
| 2007/0022359 A1 | 1/2007 | Katoh et al. |
| 2007/0029625 A1 | 2/2007 | Lue et al. |
| 2007/0031999 A1 | 2/2007 | Ho et al. |
| 2007/0048916 A1 | 3/2007 | Suzuki et al. |
| 2007/0049048 A1 | 3/2007 | Rauf et al. |
| 2007/0051306 A1 | 3/2007 | Ivanov et al. |
| 2007/0066087 A1 | 3/2007 | Jung |

(56) References Cited

U.S. PATENT DOCUMENTS

| | | |
|---|---|---|
| 2007/0121380 A1 | 5/2007 | Thomas |
| 2007/0200168 A1 | 8/2007 | Ozawa et al. |
| 2007/0202708 A1 | 8/2007 | Luo et al. |
| 2007/0210371 A1 | 8/2007 | Hisamoto et al. |
| 2007/0215940 A1 | 9/2007 | Ligon |
| 2007/0231991 A1 | 10/2007 | Willer et al. |
| 2007/0232007 A1 | 10/2007 | Forbes |
| 2007/0246753 A1 | 10/2007 | Chu et al. |
| 2007/0262451 A1 | 11/2007 | Rachmady et al. |
| 2007/0267687 A1 | 11/2007 | Lue |
| 2007/0268753 A1 | 11/2007 | Lue et al. |
| 2007/0272916 A1 | 11/2007 | Wang et al. |
| 2007/0272971 A1 | 11/2007 | Lee et al. |
| 2008/0009115 A1 | 1/2008 | Willer et al. |
| 2008/0020853 A1 | 1/2008 | Ingebrigtson |
| 2008/0029399 A1 | 2/2008 | Tomita et al. |
| 2008/0048237 A1 | 2/2008 | Iwata |
| 2008/0054346 A1 | 3/2008 | Saitoh et al. |
| 2008/0057644 A1 | 3/2008 | Kwak et al. |
| 2008/0087942 A1 | 4/2008 | Hsu et al. |
| 2008/0087946 A1 | 4/2008 | Hsu et al. |
| 2008/0121932 A1 | 5/2008 | Ranade |
| 2008/0135946 A1 | 6/2008 | Yan |
| 2008/0146042 A1 | 6/2008 | Kostamo et al. |
| 2008/0150003 A1 | 6/2008 | Chen et al. |
| 2008/0175053 A1 | 7/2008 | Lue et al. |
| 2008/0230853 A1 | 9/2008 | Jang et al. |
| 2008/0237684 A1 | 10/2008 | Specht et al. |
| 2008/0237694 A1 | 10/2008 | Specht et al. |
| 2008/0258203 A1 | 10/2008 | Happ et al. |
| 2008/0272424 A1 | 11/2008 | Kim et al. |
| 2008/0286927 A1 | 11/2008 | Kim et al. |
| 2008/0290398 A1 | 11/2008 | Polishchuk et al. |
| 2008/0290399 A1 | 11/2008 | Levy et al. |
| 2008/0290400 A1 | 11/2008 | Jenne et al. |
| 2008/0291726 A1 | 11/2008 | Lue et al. |
| 2008/0293207 A1 | 11/2008 | Koutny et al. |
| 2008/0293254 A1 | 11/2008 | Ramkumar et al. |
| 2008/0293255 A1 | 11/2008 | Ramkumar |
| 2008/0296664 A1 | 12/2008 | Ramkumar et al. |
| 2009/0011609 A1 | 1/2009 | Ramkumar et al. |
| 2009/0039414 A1 | 2/2009 | Lue et al. |
| 2009/0039416 A1 | 2/2009 | Lai et al. |
| 2009/0045452 A1 | 2/2009 | Lue et al. |
| 2009/0065849 A1 | 3/2009 | Noda |
| 2009/0152618 A1 | 6/2009 | Matsuo et al. |
| 2009/0152621 A1 | 6/2009 | Polishchuk et al. |
| 2009/0179253 A1 | 7/2009 | Levy et al. |
| 2009/0206385 A1 | 8/2009 | Kim et al. |
| 2009/0227116 A1 | 9/2009 | Joo et al. |
| 2009/0242969 A1 | 10/2009 | Tanaka |
| 2009/0294828 A1 | 12/2009 | Ozawa et al. |
| 2009/0294836 A1 | 12/2009 | Kiyotoshi |
| 2009/0294844 A1 | 12/2009 | Tanaka et al. |
| 2009/0302365 A1 | 12/2009 | Bhattacharyya |
| 2010/0006922 A1 | 1/2010 | Matsuoka et al. |
| 2010/0041222 A1 | 2/2010 | Puchner et al. |
| 2010/0096687 A1 | 4/2010 | Balseanu et al. |
| 2010/0117138 A1 | 5/2010 | Huerta et al. |
| 2010/0117139 A1 | 5/2010 | Lue |
| 2010/0155823 A1 | 6/2010 | Lue et al. |
| 2010/0178759 A1 | 7/2010 | Kim et al. |
| 2010/0252877 A1 | 10/2010 | Nakanishi et al. |
| 2010/0270609 A1 | 10/2010 | Olsen et al. |
| 2010/0283097 A1 | 11/2010 | Endoh et al. |
| 2010/0295118 A1 | 11/2010 | Bhattacharyya |
| 2011/0018053 A1 | 1/2011 | Lo et al. |
| 2011/0163371 A1 | 7/2011 | Song et al. |
| 2011/0233512 A1 | 9/2011 | Yang et al. |
| 2011/0237060 A1 | 9/2011 | Lee et al. |
| 2011/0248332 A1 | 10/2011 | Levy et al. |
| 2012/0007167 A1 | 1/2012 | Hung et al. |
| 2012/0061744 A1 | 3/2012 | Hwang et al. |
| 2012/0068159 A1 | 3/2012 | Fujiki et al. |
| 2012/0068250 A1 | 3/2012 | Ino et al. |
| 2013/0175604 A1 | 7/2013 | Polishchuk et al. |
| 2013/0309826 A1 | 11/2013 | Ramkumar et al. |
| 2014/0264551 A1 | 9/2014 | Polishchuk et al. |
| 2016/0300724 A1 | 10/2016 | Levy et al. |

FOREIGN PATENT DOCUMENTS

| | | |
|---|---|---|
| CN | 1832201 A | 9/2006 |
| CN | 101517714 A | 8/2009 |
| CN | 101859702 A | 10/2010 |
| CN | 102142454 A | 8/2011 |
| CN | 101558481 B | 5/2012 |
| CN | 104254921 A | 12/2014 |
| JP | 2004172616 A | 6/2004 |
| JP | 2005183940 A | 7/2005 |
| JP | 2005347679 A | 12/2005 |
| JP | 2007515060 A | 6/2007 |
| JP | 2007318112 | 12/2007 |
| JP | 2009535800 A | 10/2009 |
| JP | 2009260070 A | 11/2009 |
| JP | 2009272348 A | 11/2009 |
| JP | 2010182939 A | 8/2010 |
| JP | 2011507231 A | 3/2011 |
| JP | 2011527824 A | 11/2011 |
| JP | 2012004249 A | 1/2012 |
| KR | 20040070669 A | 8/2004 |
| KR | 20060100092 | 9/2006 |
| KR | 20110093746 A | 8/2011 |
| TW | 200703671 A | 1/2007 |
| TW | 200847343 A | 12/2008 |
| WO | 2007064048 A1 | 6/2007 |
| WO | 2008129478 A | 10/2008 |
| WO | 2007022359 A3 | 5/2009 |
| WO | 2011162725 A1 | 12/2011 |
| WO | 2013148112 A1 | 10/2013 |
| WO | 2013148343 A1 | 10/2013 |

OTHER PUBLICATIONS

Hua-Ching Chien, Chin-Hsing Kao, Jui-Wen Chang and Tzung-Kuen Tsai_Two-bit SONOS type Flash using a band engineering in the nitride layer_Dated Jun. 17, 2005_4 pages.

Hung et al., High-performance gate-all-around polycrystalline silicon nanowire with silicon nanocrystals nonvolatile memory, Appl. Phys. Lett, 98 162108 (2011), pub date: Apr. 22, 2011.

International Search Report for International Application No. PCT/US08/06627 dated Aug. 26, 2008; 2 pages.

International Search Report for International Application No. PCT/US13/48876 dated Jul. 26, 2013; 5 pages.

Krishnaswamy Ramkumar_Cypress SONOS Technology_Dated Jul. 6, 2011_9 pages.

Lue et al., "BE-SONOS: A Bandgap Engineered SONOS with Excellent Performance and Reliability," IEEE, 2005; 4 pages.

Lue, Hang-Ting et al., "Reliability Model of Bandgap Engineered SONOS (be-SONOS)", IEEE, 2006, 4 pgs.

Milton Ohring, "The Materials Science of Thin Films: Deposition and Structure," 2nd Edition, Academic Press, 2002, pp. 336-337; 4 pages.

SIPO Office Action for Chinese Application No. 2013800319699 dated Jan. 29, 2018; 7 pages.

SIPO Office Action for Chinese Application No. 2013800319699 dated May 31, 2017; 17 pages.

SIPO Office Action for CN Application No. 201380031969.9 dated Aug. 19, 2016; 8 pages.

TIPO Office Action for Taiwan Patent Application No. 106121057 dated Jun. 1, 2018; 3 pages.

USPTO Advisory Action for U.S. Appl. No. 12/197,466 dated Jan. 31, 2012; 3 pages.

USPTO Advisory Action for U.S. Appl. No. 14/605,231 dated Mar. 9, 2016; 3 pages.

USPTO Advisory Action for U.S. Appl. No. 14/605,231 dated Jul. 5, 2016; 3 pages.

USPTO Final Rejection for U.S. Appl. No. 12/124,855 dated Jan. 31, 2012; 7 pages.

(56) References Cited

OTHER PUBLICATIONS

USPTO Final Rejection for U.S. Appl. No. 12/124,855 dated May 10, 2010; 11 pages.
USPTO Final Rejection for U.S. Appl. No. 12/197,466 dated Nov. 17, 2011; 13 pages.
USPTO Final Rejection for U.S. Appl. No. 14/605,231 dated Dec. 17, 2015; 15 pages.
USPTO Final Rejection for U.S. Appl. No. 14/605,231 dated Jul. 10, 2017; 8 pages.
USPTO Non Final Rejection for U.S. Appl. No. 13/539,458 dated Mar. 13, 2013; 5 pages.
USPTO Non Final Rejection for U.S. Appl. No. 13/539,458 dated Oct. 2, 2014; 5 pages.
USPTO Non Final Rejection for U.S. Appl. No. 13/620,071 dated Apr. 3, 2014; 12 pages.
USPTO Non Final Rejection for U.S. Appl. No. 13/620,071 dated Jul. 18, 2014; 5 pages.
USPTO Non-Final Rejection for U.S. Appl. No. 12/124,855 dated Jan. 18, 2011; 5 pages.
USPTO Non-Final Rejection for U.S. Appl. No. 12/124,855 dated Aug. 16, 2011; 9 pages.
USPTO Non-Final Rejection for U.S. Appl. No. 12/197,466 dated Jun. 1, 2011; 11 pages.
USPTO Non-Final Rejection for U.S. Appl. No. 14/605,231 dated Jul. 7, 2015; 13 pages.
USPTO Notice of Allowance for U.S. Appl. No. 12/124,855 dated May 1, 2012; 7 pages.
USPTO Notice of Allowance for U.S. Appl. No. 12/124,855 dated May 3, 2011; 7 pages.
USPTO Notice of Allowance for U.S. Appl. No. 12/124,855 dated Jul. 28, 2010; 6 pages.
USPTO Notice of Allowance for U.S. Appl. No. 12/124,855 dated Aug. 1, 2012; 7 pages.
USPTO Notice of Allowance for U.S. Appl. No. 12/197,466 dated Jun. 15, 2012; 4 pages.
USPTO Notice of Allowance for U.S. Appl. No. 12/197,466 dated Sep. 24, 2012; 8 pages.
USPTO Notice of Allowance for U.S. Appl. No. 13/539,458 dated May 24, 2013; 8 pages.
USPTO Notice of Allowance for U.S. Appl. No. 13/539,458 dated Aug. 4, 2014; 7 pages.
USPTO Notice of Allowance for U.S. Appl. No. 13/539,458 dated Nov. 3, 2014; 7 pages.
USPTO Notice of Allowance for U.S. Appl. No. 13/620,071 dated Jan. 23, 2015; 5 pages.
USPTO Notice of Allowance for U.S. Appl. No. 13/620,071 dated Oct. 27, 2014; 7 pages.
USPTO Notice of Allowance for U.S. Appl. No. 14/605,231 dated Oct. 18, 2017; 8 pages.
USPTO Requirement Restriction for U.S. Appl. No. 12/197,466 dated Mar. 11, 2011; 5 pages.
Wang, Szu-Yu et al., "Reliability and processing effects of bandgap engineered SONOS flash memory", 2007 IEEE, International Reliability Symposium, Apr. 18, 2007, 5 pgs.
Written Opinion of the International Searching Authority for International Application No. PCT/US08/06627 dated Aug. 26, 2008; 5 pages.
Written Opinion of the International Searching Authority for International Application No. PCT/US13/48876 dated Jul. 26, 2013; 3 pages.
Wu et al., "SONOS Device with Tapered Bandgap Nitride Layer," IEEE Transactions on Electron Devices, May 2005, vol. 52, No. 5, pp. 987-992; 6 pages.
Yang et al., "Reliability considerations in scaled SONOS nonvolatile memory devices, solid state Electronics", 43(1999) 2025-2032.
"MAX 9000 Programmable Logic Device Family," Altera, Jul. 1999, Version 6.01, pp. 1-40; 41 pages.
L. Richard Carley, "Trimming Analog Circuits Using Floating-Gate Analog MOS Memory," IEEE Journal of Solid-State Circuits, vol. 24, No. 6, Dec. 1989, pp. 1569-1575; 7 pages.

"1.8V, 500-MHz, 10-Output JEDEC-Compliant Zero Delay Buffer," Cypress Advance Information, Feb. 12, 2004; 9 pages.
"10 Gigabit Ethernet Technology Overview White Paper", Revision 1.0, Retrieved from Internet: URL: http://www.10gea.org, May, 2001.
"16K x 8/9 Dual-Port Static RAM with Sem, Int, Busy," Cypress Semiconductor Data Book, May 1995, CY7C006 and CY7C016, pp. 6:1-17; 10 pages.
"1K x 8 Dual-Port Static RAM," Cypress Semiconductor Data Book, May 1995, CY7C130/CY7C131 and CY7C140/CY7C141, pp. 6:37-49; 8 pages.
"1kHz to 30MHz Resistor Set SOT-23 Oscillator", Initial Release Final Electrical Specifications LTC1799, Linear Technology Corporation, Jan. 2001, pp. 1-4.
"200-MBaud HOTLink Transceiver," Cypress Semiconductor Corporation, Revised Feb. 13, 2004, CY7C924ADX, Document #38-02008 Rev. *D; 62 pages.
"2K x 16 Dual-Port Static RAM," Cypress Semiconductor Data Book, May 1995, CY7C133 and CY7C143, pp. 6:63-73; 7 pages.
"2K x 8 Dual-Port Static RAM," Cypress Semiconductor Data Book, May 1995, CY7C132/CY7C136 and CY7C142/CY7C146, pp. 6:50-62; 8 pages.
"3.3V 64K x 18 Synchronous QuadPort Static RAM," Cypress Preliminary CY7C0430BV, Cypress Semiconductor Corporation, Mar. 27, 2001; 36 pages.
"A Novel Integration Technology of EEPROM Embedded CMOS Logic VLSI Suitable for ASIC Applications", by Masataka Takebuchi et al., IEEE 1992 Custom Integrated Circuits Conference, pp. 9.6.1-9.6.4.
"A Novel Robust and Low Cost Stack Chips Package and Its Thermal Performance", by Soon-Jin Cho et al., IEEE Transaction on Advanced Packaging, vol. 23, No. 2, May 2000, pp. 257-265.
"A Planar Type EEPROM Cell Structure by Standard CMOS Process for Integration with Gate Array, Standard Cell, Microprocessor and for Neural Chips", by Katsuhiko Ohsaki et al., IEEE 1993 Custom Integrated Circuits Conference, pp. 23.6.1-23.6.4.
"A Single Chip Sensor & Image Processor for Fingerprint Verification" Anderson, S., et al., IEEE Custom Integrated Circuits Conference, May 12-15, 1991.
"A Single Poly EPROM for Custom CMOS Logic Applications", by Reza Kazerounian et al., IEEE 1986 Custom Integrated Circuits Conference, pp. 59-62.
"A Wide-Bandwidth Low-Voltage PLL for PowerPC.TM. Microprocessors", by Jose Alvarez et al., IEEE Journal of Solid-State Circuits, vol. 30, No. 4, Apr. 1995, pp. 383-391.
"About SMaL Camera Technologies, Inc.", SMaL Camera Technologies, 2001, 1 page.
"Achieving Uniform nMOS Device Power Distribution for Sub-micron ESD Reliability;" Charvaka Duvvury, Carlos Diaz, and Tim Haddock; 1992; 92-131 through 92-134, no month.
"ADNS-2030 High Performance, Low Power Optical Mouse Sensor (Optimized for Cordless Mouse Applications)," Agilent Technologies, downloaded Oct. 10, 2005, <http://www.home.agilent.com/USeng/nav/-536893734,536883737/pd.html>; 2 pages.
"ADNS-2051 High-Performance Optical Mouse Sensor," Agilent Technologies, downloaded Oct. 10, 2005, <http://www.home.agilent.com/USeng/nav/-536893734,536883737/pd.html>; 2 pages.
"Agilent ADNK-2030 Solid-State Optical Mouse Sensor," Agilent Technologies Inc., Sample Kit, 2003; 1 page.
"Agilent ADNS-2030 Low Power Optical Mouse Sensor," Agilent Technologies Inc., Data Sheet, 2005; 34 pages.
"Agilent ADNS-2051 Optical Mouse Sensor," Agilent Technologies Inc., Product Overview, 2003; 2 pages.
"Agilent Optical Mouse Sensors," Agilent Technologies Inc., Selection Guide, 2004; 3 pages.
"Algorithm for Managing Multiple First-In, First-Out Queues from a Single Shared Random-Access Memory," IBM Technical Disclosure Bulletin, Aug. 1989; 5 pages.
SIPO Office Action for Application No. 200910134374.1 dated Jul. 30, 2015; 2 pages.
SIPO Office Action for Application No. 200910134374.1 dated Sep. 22, 2013; 4 pages.

(56) References Cited

OTHER PUBLICATIONS

SIPO Office Action for Application No. 20120000107.5 dated Apr. 1, 2015; 5 pages.
SIPO Office Action for Application No. 20120000107.5 dated May 12, 2016; 5 pages.
SIPO Office Action for Application No. 20120000107.5 dated Jul. 25, 2014; 4 pages.
SIPO Office Action for Application No. 20120000107.5 dated Sep. 20, 2017; 6 pages.
SIPO Office Action for Application No. 20120000107.5 dated Oct. 9, 2015; 2 pages.
SIPO Office Action for Application No. 201280000107.5 dated Nov. 29, 2016; 5 pages.
SIPO Office Action for Application No. 2013800168932 dated Sep. 1, 2016; 7 pages.
SIPO Office Action for Chinese Application No. 2013800168932 dated Jan. 26, 2018; 11 pages.
SIPO Office Action for Chinese Application No. 2013800168932 dated Jul. 4, 2018; 7 pages.
SIPO Office Action for International Application No. 2013800168932 dated Apr. 21, 2017; 7 pages.
TIPO Office Action for Application No. 102110223 dated Nov. 18, 2016; 10 pages.
TIPO Office Action for Taiwan Application No. 101101220 dated Oct. 15, 2015; 4 pages.
TIPO Office Action for Taiwan Application No. 106107213 dated Jul. 4, 2017; 12 pages.
USPTO Advisory Action for U.S. Appl. No. 11/811,958 dated Jun. 2, 2011; 5 pages.
USPTO Advisory Action for U.S. Appl. No. 13/436,872 dated Aug. 4, 2015; 2 pages.
KIPO Office Action for International Application No. 10-2012-7008106 dated Jan. 29, 2019; 3 pages.
Korean Intellectual Property Office Office Action for international application No. 10-2014-7025059 dated Mar. 29, 2019, 5 pages.
USPTO Notice of Allowance for U.S. Appl. No. 15/189,668 dated Mar. 21, 2019, 7 pages.
USPTO Final Rejection for U.S. Appl. No. 15/376,282 dated Dec. 5, 2018, 17 pages.
USPTO Non-Final Rejection for U.S. Appl. No. 15/099,025 dated Dec. 31, 2018, 9 pages.
USPTO Notice of Allowance for U.S. Appl. No. 14/605,231 dated Nov. 16, 2018, 7 pages.
USPTO Notice of Allowance for U.S. Appl. No. 15/864,832 dated Jan. 18, 2019, 8 pages.
KIPO Office Action for International Application No. 10-2012-7008106 dated Oct. 5, 2018; 3 pages.
SIPO Office Action for Chinese Application No. 2013800319699 dated Aug. 20, 2018; 7 pages.
USPTO Final Rejection for U.S. Appl. No. 15/864,832 dated Nov. 1, 2018, 23 pages.
"Am99C10A 256.times.48 Content Addressable Memory", Advanced Micro Devices, Dec. 1992.
"An Analog PPL-Based Clock and Data Recovery Circuit with High Input Jitter Tolerance;" Sun, Reprinted from IEEE Journal of Solid-State Circuits, 1989; 4 pages.
"An EEPROM for Microprocessors and Custom Logic", by Roger Cuppens et al., IEEE Journal of Solid-State Circuits, vol. SC-20, No. 2, Apr. 1985, pp. 603-608.
"An EPROM Cell Structure foe EPLDs Compatible with Single Poly Gate Process", by Kuniyushi Yoshikawa et al., Extended Abstracts of the 18th (1986 International) Conference on Solid State Devices and Materials, Tokyo, 1986, pp. 323-326.
"An Experimental 5-V-Only 256-kbit CMOS EEPROM with a High-Performance Single-Polysilicon Cell", by Jun-Ichi Miyamoto et al., IEEE Journal of Solid State Circuits, vol. SC-21, No. 5, Oct. 1986, pp. 852-860.
Chen et al., "Performance Improvement of SONOS Memory by Bandgap Engineering of Charge-Trapping Layer," IEEE Electron Device Letters, Apr. 2004, vol. 25, No. 4, pp. 205-207; 3 pages.

International Search Report for International Application No. PCT/US13/48885 dated Nov. 14, 2013; 2 pages.
SIPO Office Action for Application No. 201380031840.8 dated Jan. 6, 2017; 8 pages.
SIPO Office Action for Application No. 201380031840.8 dated Sep. 25, 2017; 6 pages.
USPTO Final Rejection for U.S. Appl. No. 14/307,858 dated Oct. 8, 2015; 6 pages.
USPTO Final Rejection for U.S. Appl. No. 15/376,282 dated Dec. 19, 2017; 19 pages.
USPTO Non-Final Rejection for U.S. Appl. No. 12/124,855 dated Oct. 29, 2009; 9 pages.
USPTO Non-Final Rejection for U.S. Appl. No. 12/152,518 dated Mar. 9, 2011; 4 pages.
USPTO Non-Final Rejection for U.S. Appl. No. 12/152,518 dated Sep. 29, 2010; 5 pages.
USPTO Non-Final Rejection for U.S. Appl. No. 13/288,919 dated Jun. 19, 2014; 5 pages.
USPTO Non-Final Rejection for U.S. Appl. No. 13/288,919 dated Dec. 5, 2013; 4 pages.
USPTO Non-Final Rejection for U.S. Appl. No. 13/539,466 dated Sep. 28, 2012; 9 pages.
USPTO Non-Final Rejection for U.S. Appl. No. 14/159,315 dated Oct. 21, 2014; 12 pages.
USPTO Non-Final Rejection for U.S. Appl. No. 14/307,858 dated Jun. 29, 2015; 5 pages.
USPTO Non-Final Rejection for U.S. Appl. No. 15/376,282 dated Jun. 11, 2018; 17 pages.
USPTO Non-Final Rejection for U.S. Appl. No. 15/864,832 dated May 15, 2018; 17 pages.
USPTO Non-Final Rejection for U.S. Appl. No. 15/335,180 dated May 17, 2017; 20 pages.
USPTO Non-Final Rejection for U.S. Appl. No. 15/376,282 dated Jul. 11, 2017; 16 pages.
USPTO Notice of Allowance for U.S. Appl. No. 12/152,518 dated Jul. 14, 2011; 6 pages.
USPTO Notice of Allowance for U.S. Appl. No. 13/288,919 dated Apr. 28, 2014; 5 pages.
USPTO Notice of Allowance for U.S. Appl. No. 13/288,919 dated Jul. 8, 2014; 5 pages.
USPTO Notice of Allowance for U.S. Appl. No. 13/288,919 dated Aug. 26, 2014; 7 pages.
USPTO Notice of Allowance for U.S. Appl. No. 13/539,466 dated Sep. 4, 2013; 9 pages.
USPTO Notice of Allowance for U.S. Appl. No. 13/539,466 dated Nov. 13, 2013; 9 pages.
USPTO Notice of Allowance for U.S. Appl. No. 13/539,466 dated Nov. 27, 2012; 8 pages.
USPTO Notice of Allowance for U.S. Appl. No. 14/159,315 dated Feb. 18, 2015; 9 pages.
USPTO Notice of Allowance for U.S. Appl. No. 14/159,315 dated Mar. 23, 2015; 9 pages.
USPTO Notice of Allowance for U.S. Appl. No. 14/307,858 dated Nov. 27, 2015; 5 pages.
USPTO Notice of Allowance for U.S. Appl. No. 14/811,346 dated Jul. 19, 2016; 7 pages.
USPTO Notice of Allowance for U.S. Appl. No. 15/335,180 dated Oct. 4, 2017; 9 pages.
USPTO Requirement for Restriction for U.S. Appl. No. 12/152,518 dated Jun. 9, 2010; 5 pages.
USPTO Requirement for Restriction for U.S. Appl. No. 14/307,858 dated May 18, 2015; 7 pages.
Written Opinion of the International Searching Authority for International Application No. PCT/US2013/048885 dated Nov. 14, 2013; 7 pages.
Japanese Office Action for Japanese Application No. 2015-503338 dated Jan. 15, 2019; 11 pages.
SIPO Office Action for International Application No. 2016109914026 dated Jan. 24, 2019, 4 pages.
European Search Report for European Application No. 13767422.2 dated Mar. 30, 2017; 6 pages.
European Search Report for European Application No. 13767422.2 dated Oct. 20, 2015; 5 pages.

(56) References Cited

OTHER PUBLICATIONS

European Summons Oral Proceedings for European Application No. 13767422.2 dated May 23, 2018; 10 pages.
International Search Report for International Application No. PCT/US12/021583 dated May 8, 2012; 2 pages.
International Search Report for International Application No. PCT/US13/32339 dated May 30, 2013; 2 pages.
Japanese Office Action for Japanese Application No. 2013-549612 dated Aug. 4, 2015; 8 pages.
Japanese Office Action for Japanese Application No. 2015-503338 dated Feb. 21, 2017; 21 pages.
Japanese Office Action for Japanese Application No. 2015-503338 dated Dec. 5, 2017; 5 pages.
Japanese Office Action for Japanese Application No. 2016-123646 dated Jun. 13, 2017; 7 pages.
KIPO Office Action for International Application No. 10-2012-7008106 dated Mar. 20, 2018; 7 pages.
SIPO Office Action for Application No. 200910134374.1 dated Jan. 21, 2015; 5 pages.
SIPO Office Action for Application No. 200910134374.1 dated Feb. 3, 2016; 2 pages.
SIPO Office Action for Application No. 200910134374.1 dated Jul. 29, 2014; 5 pages.
USPTO Advisory Action for U.S. Appl. No. 11/811,958 dated Mar. 16, 2010; 4 pages.
USPTO Advisory Action for U.S. Appl. No. 11/811,958 dated Apr. 20, 2010; 6 pages.
USPTO Advisory Action for U.S. Appl. No. 11/811,958 dated May 14, 2013; 4 pages.
USPTO Final Rejection for U.S. Appl. No. 11/811,958 dated Jan. 6, 2010; 17 pages.
USPTO Final Rejection for U.S. Appl. No. 11/811,958 dated Mar. 13, 2013; 22 pages.
USPTO Final Rejection for U.S. Appl. No. 11/811,958 dated Mar. 15, 2011; 13 pages.
USPTO Final Rejection for U.S. Appl. No. 13/007,533 dated Sep. 24, 2012; 13 pages.
USPTO Final Rejection for U.S. Appl. No. 13/436,872 dated May 27, 2015; 14 pages.
USPTO Final Rejection for U.S. Appl. No. 15/099,025 dated Apr. 30, 2018; 12 pages.
USPTO Non Final Rejection for U.S. Appl. No. 11/811,958 dated Dec. 7, 2011; 13 pages.
USPTO Non Final Rejection for U.S. Appl. No. 13/007,533 dated Apr. 12, 2012; 9 pages.
USPTO Non-Final Rejection for U.S. Appl. No. 11/811,958 dated May 13, 2009; 14 pages.
USPTO Non-Final Rejection for U.S. Appl. No. 11/811,958 dated Oct. 1, 2012; 17 pages.
USPTO Non-Final Rejection for U.S. Appl. No. 11/811,958 dated Oct. 7, 2010; 12 pages.
USPTO Non-Final Rejection for U.S. Appl. No. 13/436,872 dated Dec. 19, 2014; 15 pages.
USPTO Non-Final Rejection for U.S. Appl. No. 13/917,500 dated Jan. 5, 2015; 13 pages.
USPTO Non-Final Rejection for U.S. Appl. No. 14/172,775 dated Jun. 22, 2015; 14 pages.
USPTO Non-Final Rejection for U.S. Appl. No. 15/099,025 dated Oct. 6, 2017; 11 pages.
USPTO Non-Final Rejection for U.S. Appl. No. 15/189,668 dated Sep. 22, 2017; 11 pages.
USPTO Notice of Allowance for U.S. Appl. No. 13/007,533 dated Mar. 7, 2013; 8 pages.
USPTO Notice of Allowance for U.S. Appl. No. 13/007,533 dated Jun. 18, 2013; 9 pages.
USPTO Notice of Allowance for U.S. Appl. No. 13/007,533 dated Sep. 6, 2013; 9 pages.
USPTO Notice of Allowance for U.S. Appl. No. 13/007,533 dated Nov. 27, 2012; 13 pages.
USPTO Notice of Allowance for U.S. Appl. No. 13/007,533 dated Dec. 6, 2013; 10 pages.
USPTO Notice of Allowance for U.S. Appl. No. 13/436,872 dated Jan. 15, 2016; 5 pages.
USPTO Notice of Allowance for U.S. Appl. No. 13/436,872 dated Sep. 15, 2015; 9 pages.
USPTO Notice of Allowance for U.S. Appl. No. 13/917,500 dated Jun. 1, 2015; 6 pages.
USPTO Notice of Allowance for U.S. Appl. No. 13/917,500 dated Sep. 14, 2015; 5 pages.
USPTO Notice of Allowance for U.S. Appl. No. 13/917,500 dated Dec. 31, 2015; 5 pages.
USPTO Notice of Allowance for U.S. Appl. No. 14/172,775 dated Sep. 4, 2015; 7 pages.
USPTO Notice of Allowance for U.S. Appl. No. 14/172,775 dated Dec. 18, 2015; 6 pages.
USPTO Notice of Allowance for U.S. Appl. No. 15/189,668 dated Feb. 13, 2018; 12 pages.
USPTO Notice of Allowance for U.S. Appl. No. 13/436,872 dated May 11, 2016; 5 pages.
USPTO Requirement for Restriction for U.S. Appl. No. 13/007,533 dated Dec. 6, 2011; 7 pages.
Written Opinion of the International Searching Authority for International Application No. PCT/US13/32339 dated May 30, 2013; 7 pages.
Written Opinion of the International Searching Authority for International Application No. PCT/US2012/21583 dated May 8, 2012; 4 pages.

\* cited by examiner

OXIDE-NITRIDE-OXIDE STACK HAVING MULTIPLE OXYNITRIDE LAYERS

CROSS-REFERENCE TO RELATED APPLICATIONS

This application is a continuation of U.S. application Ser. No. 15/189,668, filed Jun. 22, 2016, which is a continuation of U.S. application Ser. No. 13/436,872, filed Mar. 31, 2012, now U.S. Pat. No. 9,449,831, issued Sep. 20, 2016, which is a continuation-in-part of U.S. application Ser. No. 11/811,958, filed Jun. 13, 2007, now abandoned, which claims the benefit of priority under 35 U.S.C. 119(e) to U.S. Provisional Patent Application Ser. No. 60/931,947, filed May 25, 2007, all of which are incorporated by reference herein. This application is also related to U.S. application Ser. No. 13/007,533, filed Jan. 14, 2011, now U.S. Pat. No. 8,643,124, issued Feb. 4, 2014, and is hereby incorporated by reference in its entirety.

TECHNICAL FIELD

This invention relates to semiconductor processing and, more particularly to an oxide-nitride-oxide stack having an improved oxide-nitride or oxynitride layer and methods of forming the same.

BACKGROUND

Non-volatile semiconductor memories, such as a split gate flash memory, typically use a stacked floating gate type field effect transistors, in which electrons are induced into a floating gate of a memory cell to be programmed by biasing a control gate and grounding a body region of a substrate on which the memory cell is formed.

An oxide-nitride-oxide (ONO) stack is used as either a charge storing layer, as in silicon-oxide-nitride-oxide-silicon (SONOS) transistor, or as an isolation layer between the floating gate and control gate, as in a split gate flash memory.

FIG. 1 is a partial cross-sectional view of an intermediate structure for a semiconductor device 100, such as a memory device, having a SONOS gate stack or structure 102 including a conventional ONO stack 104 formed over a surface 106 of a silicon substrate 108 according to a conventional method. In addition, the device 100 typically further includes one or more diffusion regions 110, such as source and drain regions, aligned to the gate stack and separated by a channel region 112. Briefly, the SONOS structure 102 includes a poly-silicon (poly) gate layer 114 formed upon and in contact with the ONO stack 104. The poly gate layer 114 is separated or electrically isolated from the substrate 108 by the ONO stack 104. The ONO stack 104 generally includes a lower oxide layer 116, a nitride or oxynitride layer 118 which serves as a charge storing or memory layer for the device 100, and a top, high-temperature oxide (HTO) layer 120 overlying the nitride or oxynitride layer.

One problem with conventional SONOS structures 102 and methods of forming the same is the poor data retention of the nitride or oxynitride layer 118 that limits the device 100 lifetime and/or its use in several applications due to leakage current through the layer.

Another problem with conventional SONOS structures 102 and methods of forming the same is the stoichiometry of the oxynitride layer 118 is neither uniform nor optimized across the thickness of the layer. In particular, the oxynitride layer 118 is conventionally formed or deposited in a single step using a single process gas mixture and fixed or constant processing conditions in an attempt to provide a homogeneous layer having a high nitrogen and high oxygen concentration across the thickness of the relatively thick layer. However, due to top and bottom effects this results in nitrogen, oxygen and silicon concentrations, which can vary throughout the conventional oxynitride layer 118. The top effect is caused by the order in which process gases are shut off following deposition. In particular, the silicon containing process gas, such as silane, is typically shut off first resulting in a top portion of the oxynitride layer 118 that is high in oxygen and/or nitride and low in silicon. Similarly, the bottom effect is caused by the order in which process gases are introduced to initiate deposition. In particular, the deposition of the oxynitride layer 118 typically follows an annealing step, resulting in a peak or relatively high concentration of ammonia ($NH_3$) at the beginning of the deposition process and producing in a bottom portion of the oxynitride layer that is low in oxygen and silicon and high in nitrogen. The bottom effect is also due to surface nucleation phenomena in which that oxygen and silicon that is available in the initial process gas mixture preferentially reacts with silicon at the surface of the substrate and does not contribute to the formation of the oxynitride layer. Consequently, the charge storage characteristics, and in particular programming and erase speed and data retention of a memory device 100 made with the ONO stack 104, are adversely effected.

Accordingly, there is a need for a memory device having an ONO stack with an oxynitride layer as a memory layer that exhibits improved programming and erase speed and data retention. There is a further need for a method or process of forming an ONO stack having an oxynitride layer that exhibits improved oxynitride stoichiometry.

SUMMARY

A semiconductor memory device including a multi-layer charge storing layer and methods of forming the same are provided. Generally, the device includes a channel formed from a semiconducting material overlying a surface on a substrate connecting a source and a drain of the memory device; a tunnel oxide layer overlying the channel; and a multi-layer charge storing layer including an oxygen-rich, first oxynitride layer on the tunnel oxide layer in which a stoichiometric composition of the first oxynitride layer results in it being substantially trap free, and an oxygen-lean, second oxynitride layer on the first oxynitride layer in which a stoichiometric composition of the second oxynitride layer results in it being trap dense. In one embodiment, the device comprises a non-planar transistor including a gate having multiple surfaces abutting the channel, and the gate comprises the tunnel oxide layer and the multi-layer charge storing layer. Other embodiments are also disclosed.

BRIEF DESCRIPTION OF THE DRAWINGS

These and various other features and advantages of the present structure and method will be apparent upon reading of the following detailed description in conjunction with the accompanying drawings and the appended claims provided below, where:

DETAILED DESCRIPTION

Figure 1:
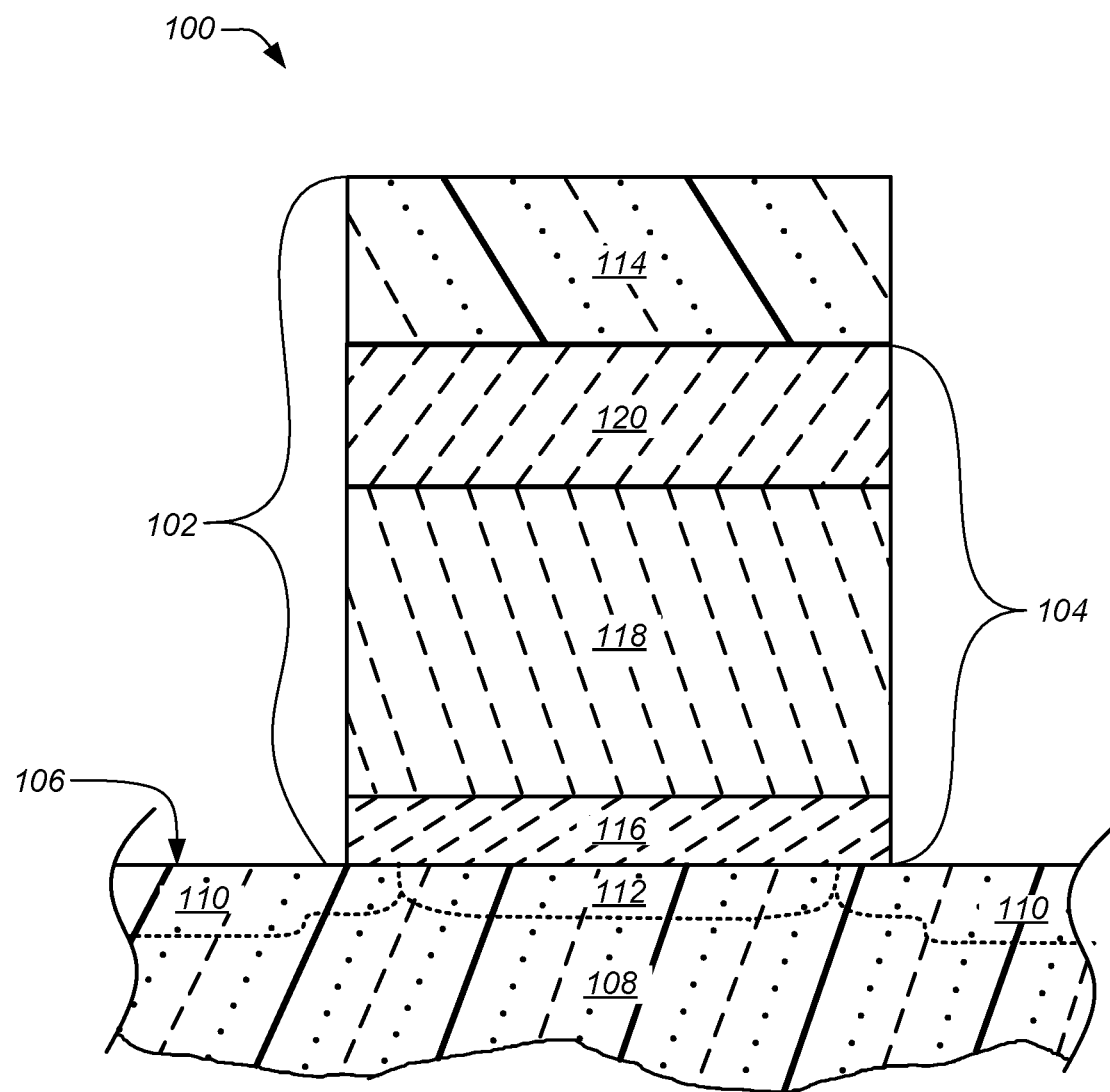
FIG. 1 (prior art) is a block diagram illustrating a cross-sectional side view of an intermediate structure for a memory device for which a method having an oxide-nitride-oxide (ONO) stack formed according to conventional method.

The present invention is directed generally to a device comprising a silicon-oxide-oxynitride-oxide-silicon gate structure including a multi-layer charge storing layer and methods for making the same. The gate structure and method are particularly useful for forming a memory layer in a memory device, such as a memory transistor.

In the following description, for purposes of explanation, numerous specific details are set forth in order to provide a thorough understanding of the present disclosure. It will be evident, however, to one skilled in the art that the present structure and method may be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment. The appearances of the phrase "in one embodiment" in various places in the specification do not necessarily all refer to the same embodiment. The term "to couple" as used herein may include both to directly connect and to indirectly connect through one or more intervening components.

Briefly, the method involves forming a multi-layer charge storing layer including multiple oxynitride layers, such as silicon oxynitride ($Si_2N_2O$) layers, having differing concentrations of Oxygen, Nitrogen and/or Silicon. The oxynitride layers are formed at higher temperatures than nitride or oxynitride layers in conventional ONO structures, and each of the layers are formed using differing process gases mixtures and/or at differing flow rates. Generally, the oxynitride layers include at least a top oxynitride layer and a bottom oxynitride layer. In certain embodiments, the stoichiometric compositions of the layers is tailored or selected such that the lower or bottom oxynitride has a high oxygen and silicon content, and the top oxynitride layer has high silicon and a high nitrogen concentration with a low oxygen concentration to produce an oxygen-lean, silicon-rich nitride or oxynitride. The silicon-rich and oxygen-rich bottom oxynitride layer reduces stored charge loss without compromising device speed or an initial (beginning of life) difference between program and erase voltages. The silicon-rich, oxygen-lean top oxynitride layer increases a difference between programming and erase voltages of memory devices, thereby improving device speed, increasing data retention, and extending the operating life of the device. In some embodiments, the silicon-rich, oxygen-lean top oxynitride layer can further include a concentration of carbon selected to increase the number of traps therein.

Optionally, the ratio of thicknesses between the top oxynitride layer and the bottom oxynitride layer can be selected to facilitate forming of the oxynitride layers over a tunneling or first oxide layer of a silicon-oxide-oxynitride-oxide-silicon gate structure following the forming of the first oxide layer using a dry or wet oxidation.

A silicon-oxide-oxynitride-oxide-silicon structure and methods for fabricating the same according to various embodiments of the present disclosure will now be described in greater detail with reference to FIGS. 2 through 4.

Figure 2:
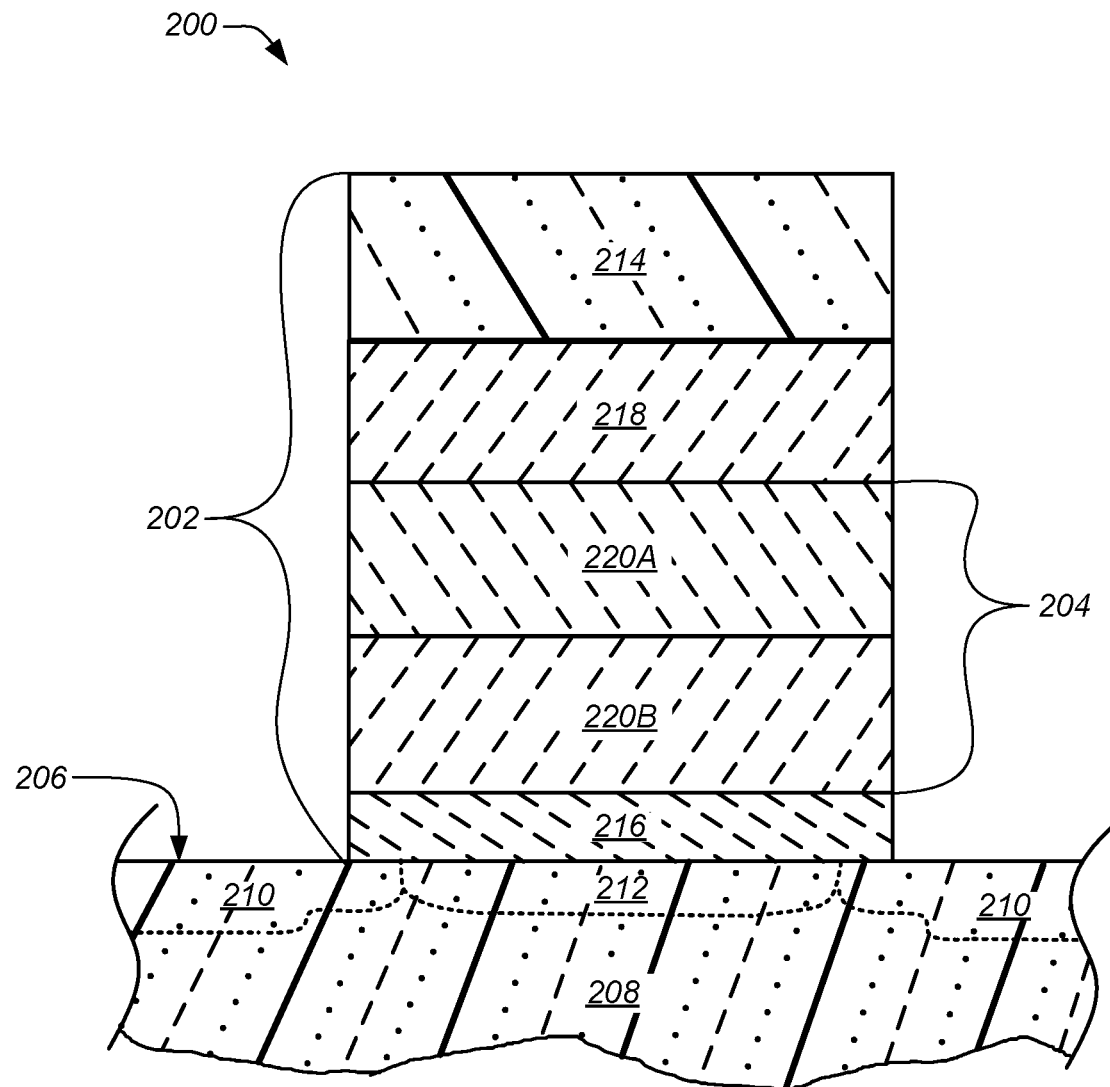
FIG. 2 is a block diagram illustrating a cross-sectional side view of a portion of a semiconductor device having a silicon-oxide-oxynitride-oxide-silicon structure including a multi-layer charge storing layer according to an embodiment of the present disclosure.

FIG. 2 is a block diagram illustrating a cross-sectional side view of a portion of a semiconductor memory device 200 having a silicon-oxide-oxynitride-oxide-silicon gate structure including a multi-layer charge storing layer according to one embodiment. Referring to FIG. 2, the memory device 200 includes a silicon-oxide-oxynitride-oxide-silicon gate structure or gate stack 202 including a multi-layer charge storing layer 204 formed over a surface 206 of silicon layer on a substrate or a silicon substrate 208. In addition, the device 200 further includes one or more diffusion regions 210, such as source and drain regions or structures, aligned to the gate stack 202 and separated by a channel region 212. Generally, the silicon-oxide-oxynitride-oxide-silicon gate structure includes a silicon containing gate layer, such as a poly-silicon or poly gate layer 214 formed upon and in contact with the multi-layer charge storing layer 204, and a portion of the silicon layer or substrate 208. The poly gate layer 214 is separated or electrically isolated from the substrate 208 by the multi-layer charge storing layer 204. The silicon-oxide-oxynitride-oxide-silicon structure includes a thin, lower oxide layer or tunneling oxide layer 216 that separates or electrically isolates the gate stack 202 from the channel region 212, a top or blocking oxide layer 218, and the multi-layer charge storing layer 204. As noted above and as shown in FIG. 2, the multi-layer charge storing layer 204 includes at least two oxynitride layers, including a top oxynitride layer 220A and a bottom oxynitride layer 220B.

The substrate 208 may include any known silicon-based semiconductor material including silicon, silicon-germanium, silicon-on-insulator, or silicon-on-sapphire substrate. Alternatively, the substrate 208 may include a silicon layer formed on a non-silicon-based semiconductor material, such as gallium-arsenide, germanium, gallium-nitride, or aluminum-phosphide. In certain embodiments, the substrate 208 is a doped or undoped silicon substrate.

The lower oxide layer or tunneling oxide layer 216 of the silicon-oxide-oxynitride-oxide-silicon structure generally includes a relatively thin layer of silicon dioxide ($SiO_2$) of from about 15 angstrom (Å) to about 22 Å, and in some embodiments about 18 Å. The tunneling oxide layer 216 can be formed or deposited by any suitable means including, for example, being thermally grown or deposited using chemical vapor deposition (CVD). Generally, the tunnel oxide layer is formed or grown using a thermal oxidation in oxygen ambient. In one embodiment, the process involves a dry oxidation method in which the substrate 208 is placed in a in a deposition or processing chamber, heated to a temperature from about 700° C. to about 850° C., and exposed to oxygen for a predetermined period of time selected based on a desired thickness of the finished tunneling oxide layer 216. In another embodiment, the tunnel oxide layer is grown in an ISSG (In-Situ Steam Generation) chamber with a radical oxidation using a reaction between oxygen ($O_2$) and hydrogen ($H_2$) on the substrate at temperatures of at least 1000° C. Exemplary process times are from about 10 to about 100 minutes. The oxidation can be performed at atmospheric or at low pressure.

As noted above, the multi-layer charge storing layer generally includes at least two oxynitride layers having differing compositions of silicon, oxygen and nitrogen, and can have an overall thickness of from about 70 Å to about 150 Å, and in certain embodiments about 100 Å. In one embodiment, the oxynitride layers are formed or deposited in a low pressure CVD process using a silicon source, such as silane (SiH4), chlorosilane ($SiH_3Cl$), dichlorosilane or DCS ($SiH_2Cl_2$), tetrachlorosilane ($SiCl_4$) or Bis-Tertiary-ButylAmino Silane (BTBAS), a nitrogen source, such as nitrogen (N2), ammonia ($NH_3$), nitrogen trioxide ($NO_3$) or nitrous oxide ($N_2O$), and an oxygen-containing gas, such as oxygen ($O_2$) or $N_2O$. Alternatively, gases in which hydrogen has been replaced by deuterium can be used, including, for example, the substitution of deuterated-ammonia ($ND_3$) for $NH_3$. The substitution of deuterium for hydrogen advantageously passivates Si dangling bonds at the silicon-oxide interface, thereby increasing an NBTI (Negative Bias Temperature Instability) lifetime of the devices.

For example, the lower or bottom oxynitride layer 220B can be deposited over the tunneling oxide layer 216 by placing the substrate 208 in a deposition chamber and introducing a process gas including $N_2O$, $NH_3$ and DCS, while maintaining the chamber at a pressure of from about 5 millitorr (mT) to about 500 mT, and maintaining the substrate at a temperature of from about 700° C. to about 850° C. and in certain embodiments at least about 760° C., for a period of from about 2.5 minutes to about 20 minutes. In particular, the process gas can include a first gas mixture of $N_2O$ and $NH_3$ mixed in a ratio of from about 8:1 to about 1:8 and a second gas mixture of DCS and $NH_3$ mixed in a ratio of from about 1:7 to about 7:1, and can be introduced at a flow rate of from about 5 to about 200 standard cubic centimeters per minute (sccm). It has been found that an oxynitride layer produced or deposited under these condition yields a silicon-rich, oxygen-rich, bottom oxynitride layer 220B, that decrease the charge loss rate after programming and after erase, which is manifested in a small voltage shift in the retention mode.

The top oxynitride layer 220A can be deposited over the bottom oxynitride layer 220B in a CVD process using a process gas including $N_2O$, $NH_3$ and DCS, at a chamber pressure of from about 5 mT to about 500 mT, and at a substrate temperature of from about 700° C. to about 850° C. and in certain embodiments at least about 760° C., for a period of from about 2.5 minutes to about 20 minutes. In particular, the process gas can include a first gas mixture of $N_2O$ and $NH_3$ mixed in a ratio of from about 8:1 to about 1:8 and a second gas mixture of DCS and $NH_3$ mixed in a ratio of from about 1:7 to about 7:1, and can be introduced at a flow rate of from about 5 to about 20 sccm. It has been found that an oxynitride layer produced or deposited under these condition yields a silicon-rich, nitrogen-rich, and oxygen-lean top oxynitride layer 220A, which improves the speed and increases of the initial difference between program and erase voltage without compromising a charge loss rate of memory devices made using an embodiment of the silicon-oxide-oxynitride-oxide-silicon structure, thereby extending the operating life of the device.

In some embodiments, the silicon-rich, nitrogen-rich, and oxygen-lean top oxynitride layer 220A can be deposited over the bottom oxynitride layer 220B in a CVD process using a process gas including BTBAS and ammonia ($NH_3$) mixed at a ratio of from about 7:1 to about 1:7 to further include a concentration of carbon selected to increase the number of traps therein. The selected concentration of carbon in the second oxynitride layer can include a carbon concentration of from about 5% to about 15%.

In certain embodiments, the top oxynitride layer 220A is deposited sequentially in the same tool used to form the bottom oxynitride layer 220B, substantially without breaking vacuum on the deposition chamber. In certain embodiments, the top oxynitride layer 220A is deposited substantially without altering the temperature to which the substrate 208 was heated during deposition of the bottom oxynitride layer 220B. In one embodiment, the top oxynitride layer 220A is deposited sequentially and immediately following the deposition of the bottom oxynitride layer 220B by decreasing the flow rate of the $N_2O/NH_3$ gas mixture relative to the $DCS/NH_3$ gas mixture to provide the desired ratio of the gas mixtures to yield the silicon-rich, nitrogen-rich, and oxygen-lean top oxynitride layer 220A.

In certain embodiments, another oxide or oxide layer (not shown in these figures) is formed after the formation of the gate stack 202 in a different area on the substrate 208 or in the device using a steam oxidation. In this embodiment, the top oxynitride layer 220A and top or blocking oxide layer 218 of the silicon-oxide-oxynitride-oxide-silicon structure are beneficially steam annealed during the steam oxidation process. In particular, steam annealing improves the quality of the top or blocking oxide layer 218 reducing the number of traps formed near a top surface of the blocking oxide layer and near a top surface of the underlying top oxynitride layer 220A, thereby reducing or substantially eliminating an electric field that could otherwise form across the blocking oxide layer, which could result in back streaming of charge carriers therethrough and adversely affecting data or charge retention in the charge storing layer.

A suitable thickness for the bottom oxynitride layer 220B has been found to be from about 10 Å to about 80 Å, and a ratio of thicknesses between the bottom layer and the top oxynitride layer has been found to be from about 1:6 to about 6:1, and in certain embodiments at least about 1:4.

The top or blocking oxide layer 218 of the silicon-oxide-oxynitride-oxide-silicon structure includes a relatively thick layer of $SiO_2$ of from about 30 Å to about 70 Å, and in certain embodiments about 45 Å. The top or blocking oxide layer 218 can be formed or deposited by any suitable means including, for example, being thermally grown or deposited using CVD. In one embodiment, the top or blocking oxide layer 218 is a high-temperature-oxide (HTO) deposited using CVD process. Generally, the deposition process involves exposing the substrate 208 to a silicon source, such as silane, chlorosilane, or dichlorosilane, and an oxygen-containing gas, such as $O_2$ or $N_2O$ in a deposition chamber at a pressure of from about 50 mT to about 1000 mT, for a period of from about 10 minutes to about 120 minutes while maintaining the substrate at a temperature of from about 650° C. to about 850° C.

In certain embodiments, the top or blocking oxide layer 218 is deposited sequentially in the same tool used to form the oxynitride layers 220A, 220B. In certain embodiments, the oxynitride layers 220A, 220B, and the top or blocking oxide layer 218 are formed or deposited in the same tool used to grow the tunneling oxide layer 216. Suitable tools include, for example, an ONO AVP, commercially available from AVIZA technology of Scotts Valley, Calif.

A method or forming or fabricating a silicon-oxide-oxynitride-oxide-silicon stack according to one embodiment will now be described with reference to the flowchart of FIG. 3.

Figure 3:
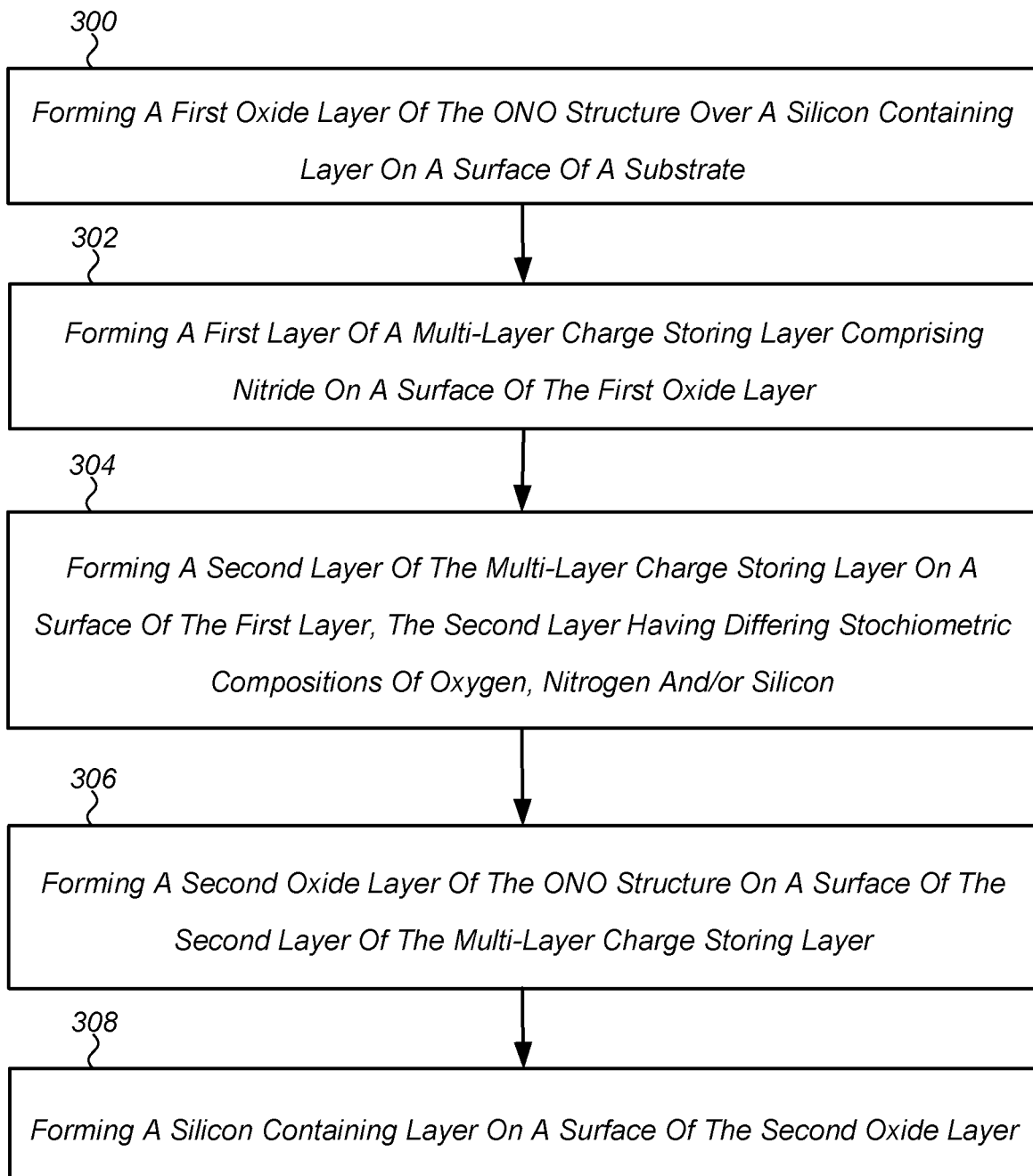
FIG. 3 is flow chart of a method for forming an oxide-oxynitride-oxide structure including a multi-layer charge storing layer according to an embodiment of the present disclosure.

Referring to FIG. 3, the method begins with forming a first oxide layer, such as a tunneling oxide layer 216, of the silicon-oxide-oxynitride-oxide-silicon gate stack 202 over a silicon containing layer on a surface of a substrate 208 (300). Next, the first or bottom oxynitride layer 220B of a multi-layer charge storing layer 204 including oxynitride is formed on a surface of the first oxide layer (302). As noted above, this first or bottom oxynitride layer 220B can be formed or deposited by a CVD process using a process gas including $N_2O/NH_3$ and $DCS/NH_3$ gas mixtures in ratios and at flow rates tailored to provide a silicon-rich and oxygen-rich oxynitride layer. The second or top oxynitride layer 220A of the multi-layer charge storing layer 204 is then formed on a surface of the first or bottom oxynitride layer 220B (304). The second or top oxynitride layer 220A has a stoichiometric composition of oxygen, nitrogen and/or silicon different from that of the first or bottom oxynitride layer 220B. In particular, and as noted above, the second or top oxynitride layer 220A can be formed or deposited by a CVD process using a process gas including $DCS/NH_3$ and $N_2O/NH_3$ gas mixtures in ratios and at flow rates tailored to provide a silicon-rich, oxygen-lean top oxynitride layer. Finally, a top or blocking oxide layer 218 of the silicon-oxide-oxynitride-oxide-silicon structure is formed on a surface of the second layer of the multi-layer charge storing layer (306). As noted above, this top or blocking oxide layer 218 can be formed or deposited by any suitable means, but in some embodiments is deposited in a CVD process. In one embodiment the top or blocking oxide layer 218 is a high temperature oxide deposited in a HTO CVD process. Alternatively, the top or blocking oxide layer 218 can be thermally grown, however it will be appreciated that in this embodiment the thickness of the top oxynitride 220A may be adjusted or increased as some of the top oxynitride will be effectively consumed or oxidized during the process of thermally growing the top or blocking oxide layer 218.

Optionally, the method may further include forming or depositing a silicon containing layer on a surface of the top or blocking oxide layer 218 to form a silicon-oxide-oxynitride-oxide-silicon stack or structure (308). The silicon containing layer can be, for example, a polysilicon layer deposited by a CVD process to form a control or poly gate layer 214 of the transistor or device 200.

A comparison of data retention for a memory device using a memory layer formed according to an embodiment of the present disclosure as compared to a memory device using a conventional memory layer will now be made with reference to FIG. 4. In particular, FIG. 4 illustrates the change in threshold voltage of devices in an electronically erasable programmable read-only memory (EEPROM) during programming (VTP) during erase (VTE) over device life for an EEPROM made using a conventional ONO structure and a silicon-oxide-oxynitride-oxide-silicon structure having a multi-layer oxynitride layer. In gathering data for this figure both devices were pre-cycled for 100K cycles at an ambient temperature of 85° C.

Figure 4:
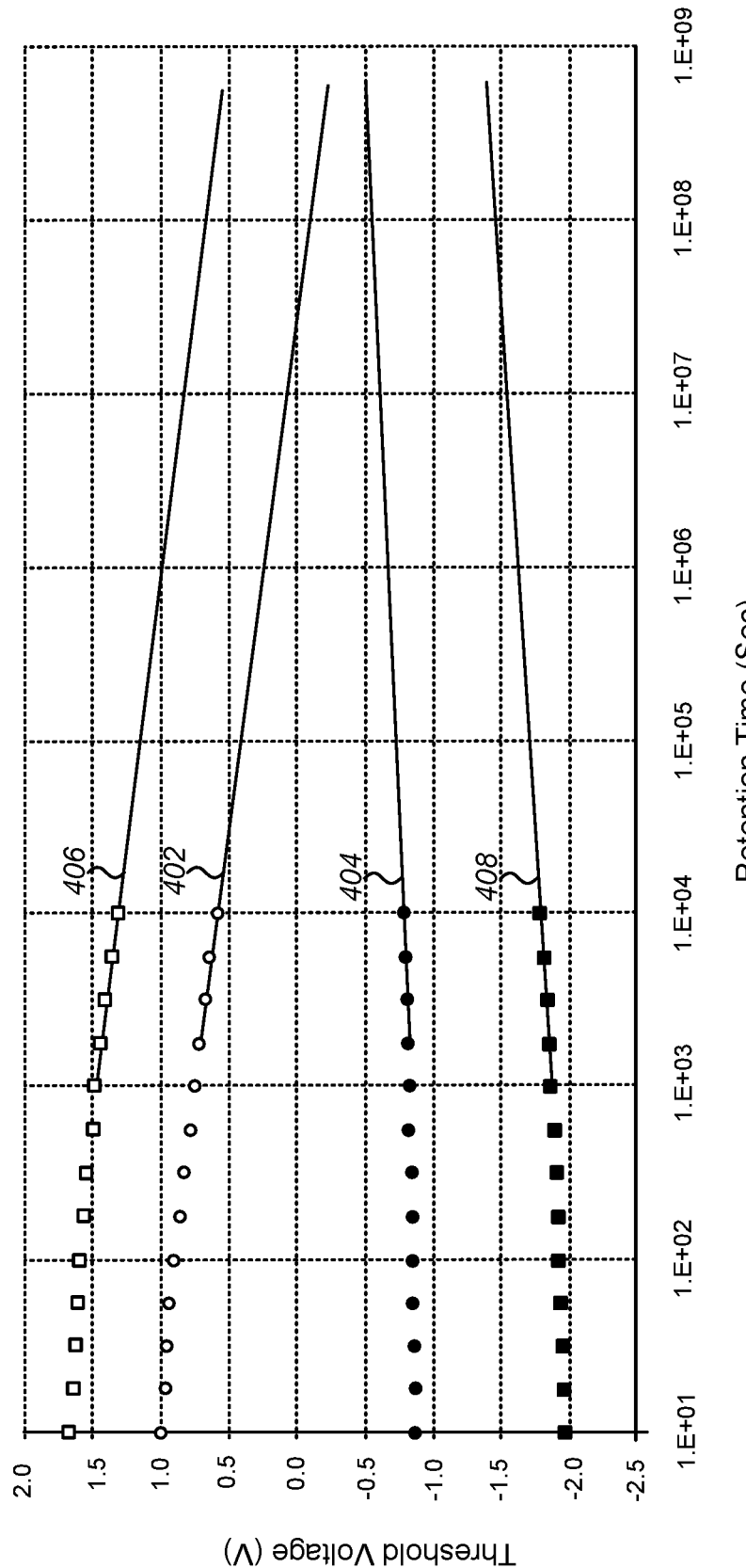
FIG. 4 is a graph showing an improvement in data retention for a memory device using a memory layer formed according to the present disclosure as compared to a memory device using a conventional memory layer.

Referring to FIG. 4, the graph or line 402 illustrates the change over time of a VTP for an EEPROM made using a conventional ONO structure having a single oxynitride layer without refreshing the memory after the initial writing—program or erase. Actual data points on line 402 are shown by unfilled circles, the remainder of the line showing an extrapolation of VTP to a specified end-of-life (EOL) for the EEPROM. Graph or line 404 illustrates the change over time of a VTE for the EEPROM made using a conventional ONO structure. Actual data points on line 404 are shown by filled circles, and the remainder of the line shows an extrapolation of VTE to EOL for the EEPROM. Generally, the specified difference between the VTE and VTP for an EEPROM at EOL is at least 0.5 V to be able to identify or sense the difference between the program and erase state. As seen from this figure an EEPROM made using a conventional ONO structure has a difference between VTE and VTP of about 0.35V at a specified EOL of 20 years. Thus, an EEPROM made using a conventional ONO structure and operated under the conditions described above will fail to meet the specified operating life by at least about 17 years.

In contrast, the change in VTP and VTE over time for an EEPROM made using a silicon-oxide-oxynitride-oxide-silicon structure having a multi-layer oxynitride layer, illustrated by lines 406 and 408 respectively, shows a difference between VTE and VTP of at least about 1.96V at the specified EOL. Thus, an EEPROM made using a silicon-oxide-oxynitride-oxide-silicon structure according to an embodiment of the present disclosure will meet and exceed the specified operating life of 20 years. In particular, graph or line 406 illustrates the change over time of VTP for an EEPROM using a silicon-oxide-oxynitride-oxide-silicon structure according to an embodiment of the present disclosure. Actual data points on line 406 are shown by unfilled squares, the remainder of the line showing an extrapolation of VTP to the specified EOL. Graph or line 408 illustrates the change over time of VTE for the EEPROM, and actual data points on line 408 are shown by filled squares, the remainder of the line showing an extrapolation of VTE to EOL.

A method or forming or fabricating a semiconductor device according to another embodiment is now described with reference to the flowchart of FIG. 5.

Figure 5:
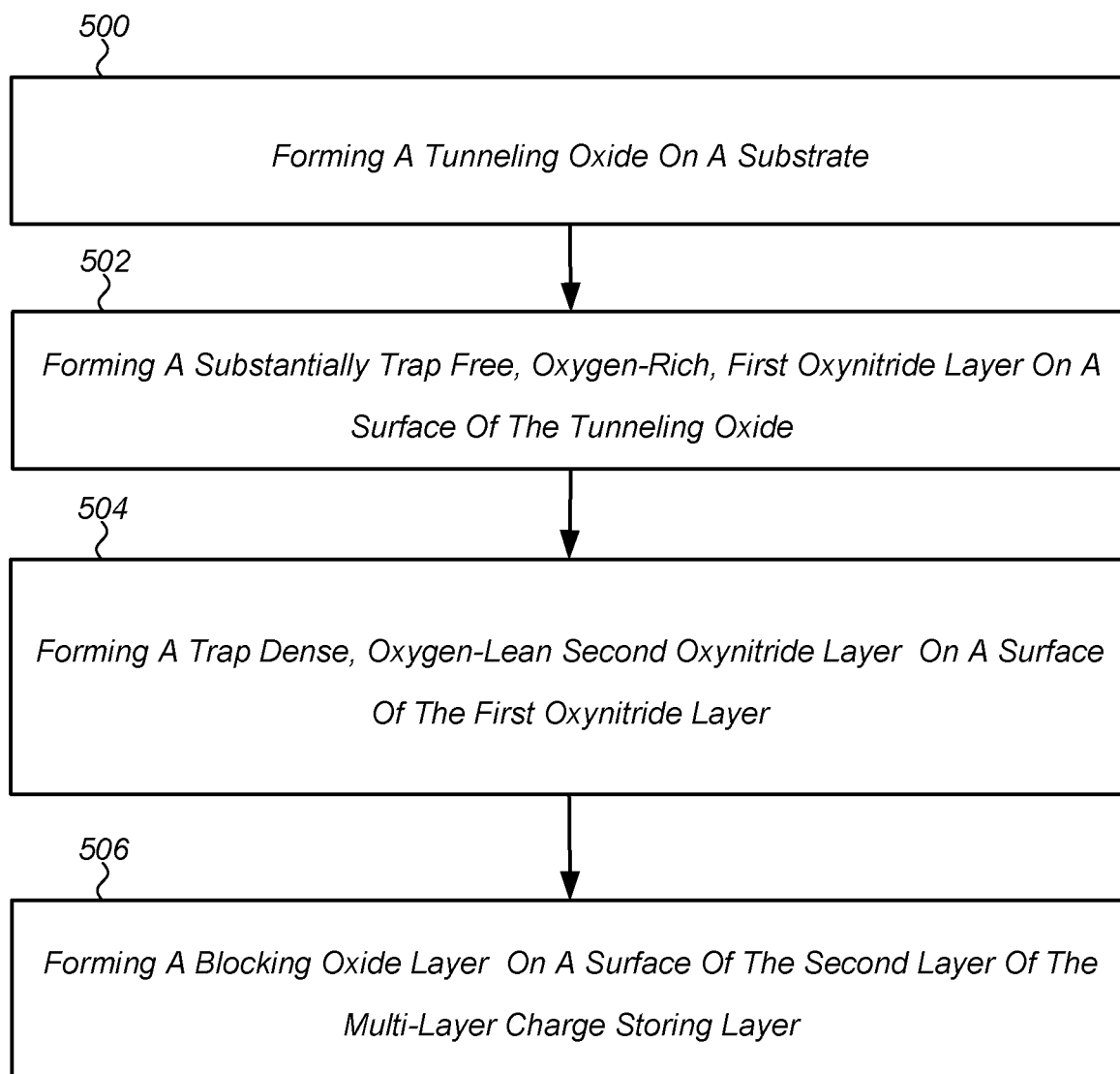
FIG. 5 is flow chart of a method for forming an oxide-oxynitride-oxide structure including a multi-layer charge storing layer according to another embodiment of the present disclosure.

Referring to FIG. 5, the method begins with forming a tunneling oxide layer 216 on a substrate (500). Next, an oxygen-rich, first or bottom oxynitride layer 220B of a multi-layer charge storing layer 204 is formed on a surface of the tunneling oxide layer 216 (502). As noted above, this oxygen-rich, first or bottom oxynitride layer 220B can be formed or deposited by a CVD process using a process gas comprising a dichlorosilane ($SiH_2Cl_2$)/ammonia ($NH_3$) mixture at a ratio in the range of about 5:1 to 15:1; and a nitrous oxide ($N_2O$)/$NH_3$ mixture at a ratio in the range of about 2:1 to 4:1 and at flow rates tailored to provide a silicon-rich and oxygen-rich oxynitride layer which is substantially trap free. That is the stoichiometric composition of the first or bottom oxynitride layer 220B comprises a high concentration of oxygen selected to increase retention performance of the multi-layer charge storing layer by acting as a barrier between charge trapped in the second or top oxynitride layer 220A and the substrate 208. The selected concentration of oxygen in the first or bottom oxynitride layer 220B can include an oxygen concentration of from about 15% to about 40%, and, in certain embodiments about 35%.

An oxygen-lean, second or top oxynitride layer 220A is then formed on a surface of the first or bottom oxynitride layer 220B (504). The second or top oxynitride layer 220A has a stoichiometric composition of oxygen, nitrogen and/or silicon different from that of the first layer. In particular, and as noted above, the second or top oxynitride layer 220A can be formed or deposited by a CVD process using a process gas using a process gas comprising a $N_2O/NH_3$ mixture at a ratio in the range of about 1:6 to 1:8 and a $SiH_2Cl_2/NH_3$ mixture at a ratio in the range of about 1.5:1 to 3:1 to provide a trap dense oxynitride layer having an oxygen concentration of about 5% or less. Thus, the second or top oxynitride layer 220A comprises a charge trap density at least 1000 times greater than the first or bottom oxynitride layer 220B.

Finally, a top or blocking oxide layer 218 is formed over the second or top oxynitride layer 220A of the multi-layer charge storing layer 204 (506). As noted above, this top or blocking oxide layer 218 can be formed or deposited by any suitable means. In one embodiment the second or blocking oxide layer 218 is formed a manner that results in thinning of the second or top oxynitride layer 220A to a predetermined thickness through oxidization of a portion of the second oxynitride layer. Finally, as noted above with respect to FIG. 4, the increased retention performance of the multi-layer charge storing layer 204 increases an end-of-life (EOL) for the semiconductor device at a specified difference between program voltage (VTP) and erase voltage (VTE) to at least about 20 years.

Figure 6:
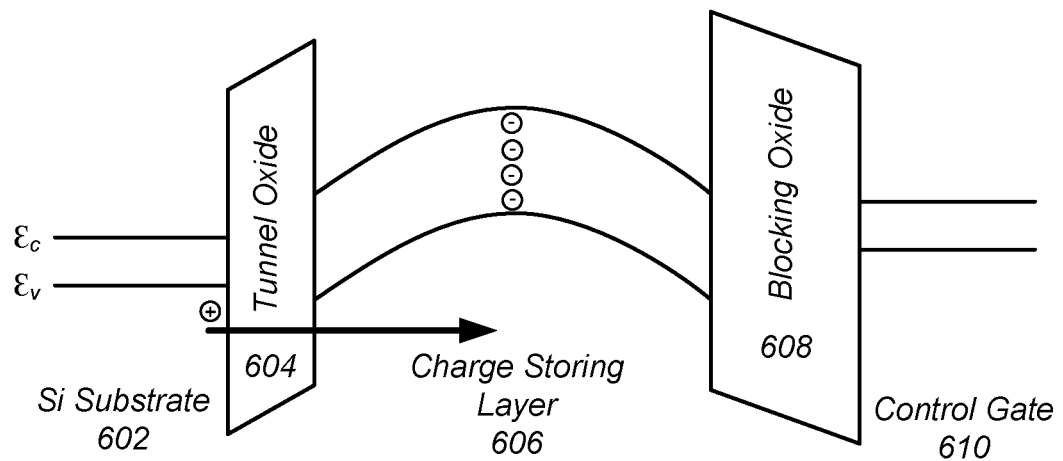
FIG. 6 is an energy band diagram of a programmed conventional memory device having an ONO structure.
Figure 7A:
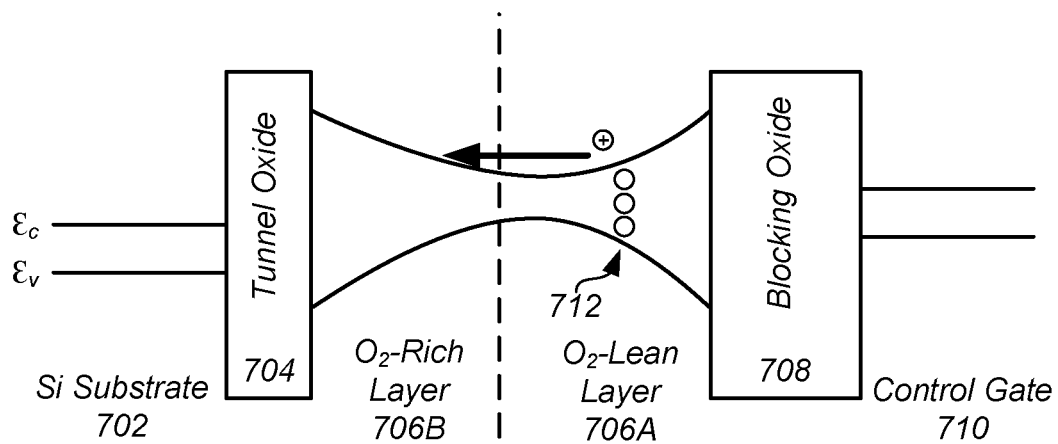
FIGS. 7A and 7B are energy band diagrams of a memory device including a multi-layer charge storing layer according to an embodiment of the present disclosure prior to and following programming.
Figure 7B:
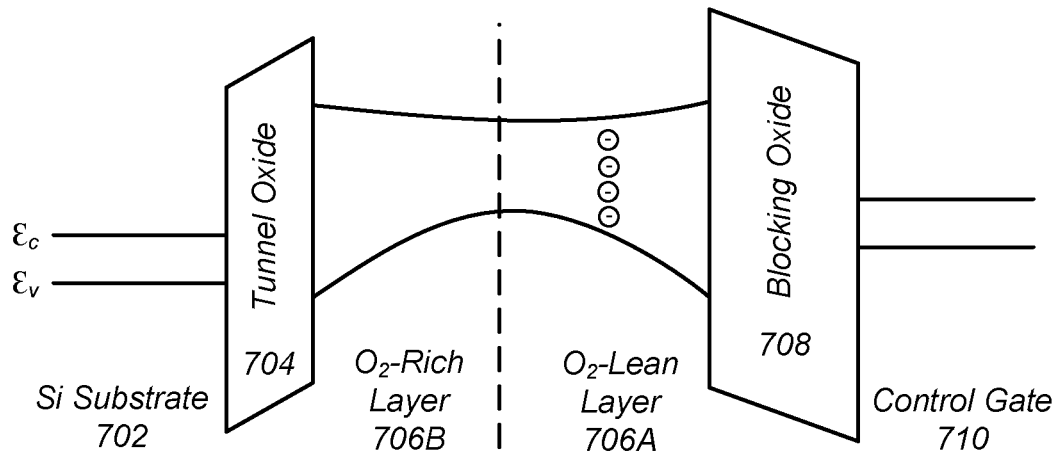

In another aspect, the multi-layer charge storing layer of the present disclosure has bandgap energy engineered to generate an electrical field opposing that built-up due to charge storage in the charge storing layer in a programmed state, thereby increasing data retention, without impacting programming voltages and/or device speed. An energy band diagram of a programmed conventional device including a channel in silicon substrate 602, a tunneling oxide layer 604, a homogeneous nitride or oxynitride charge storing layer 606, oxide blocking layer 608 and a polysilicon control gate 610 is illustrated in FIG. 6. Referring to FIG. 6, it is noted that large number of trapped charges located near the center of the charge storing layer 606 results in a build-up of a large electric field away from the tunneling oxide layer 604 towards the trapped charges, and which can cause or result in loss of stored charges In contrast, in a memory device including the multi-layer charge storing layer of the present disclosure engineering the bandgap energy multi-layer charge storing layer results in a build-up of an electrical field pointing inward (from the charge storing layer toward the tunnel oxide), which opposes the build-up of the electric field due to the stored charge increasing charge retention. An unprogrammed memory device including a multi-layer charge storing layer 706 is shown in FIG. 7A. The device includes a channel in silicon substrate 702, a tunneling oxide layer 704, an oxygen-lean oxynitride layer 706A, an oxygen-rich bottom oxynitride layer 706B, an oxide blocking layer 708 and a polysilicon control gate 710. Referring to FIG. 7A, the trap sites in the oxygen-lean top oxynitride layer 706A, produces an electric field that will oppose the electric field produced by the trapped charges in the programmed device. The resultant bandgap diagram of a device including a multi-layer charge storing layer 706 in a programmed state is shown in FIG. 7A.

Implementations and Alternatives

In another aspect the present disclosure is directed to multigate or multigate-surface memory devices including charge-trapping regions overlying two or more sides of a channel formed on or above a surface of a substrate, and methods of fabricating the same. Multigate devices include both planar and non-planar devices. A planar multigate device (not shown) generally includes a double-gate planar device in which a number of first layers are deposited to form a first gate below a subsequently formed channel, and a number of second layers are deposited thereover to form a second gate. A non-planar multigate device generally includes a horizontal or vertical channel formed on or above a surface of a substrate and surrounded on three or more sides by a gate.

Figure 8A:
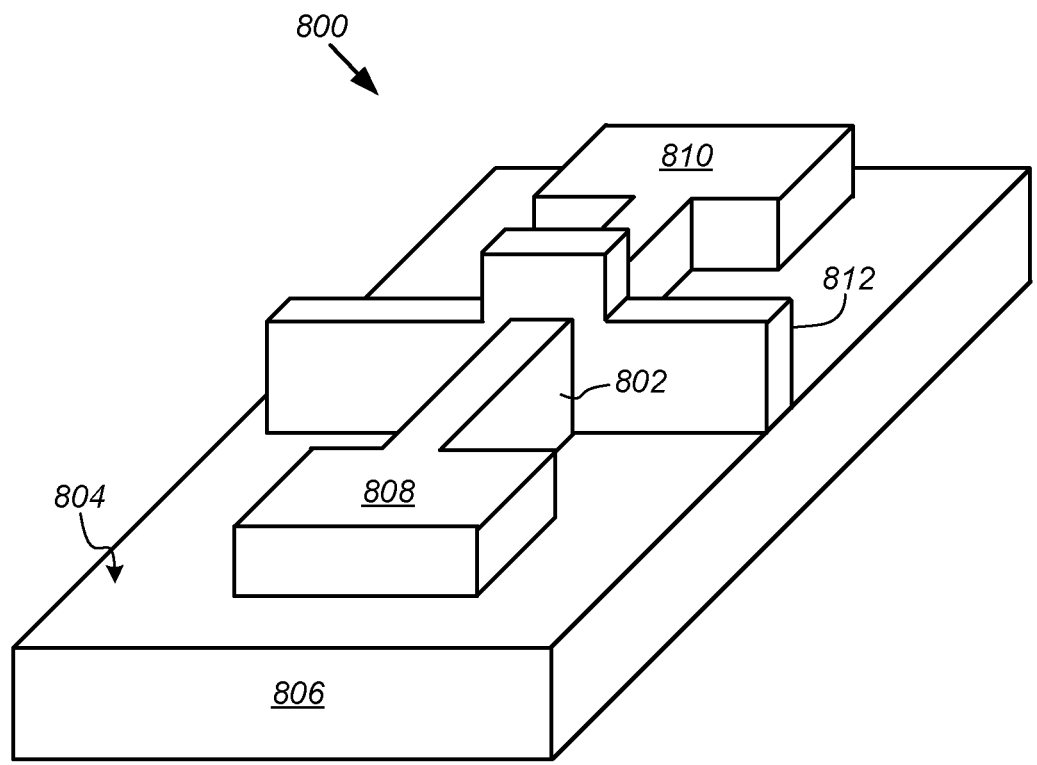
FIG. 8A illustrates a non-planar multigate device including a split charge-trapping region.

FIG. 8A illustrates one embodiment of a non-planar multigate memory device including a charge-trapping region. Referring to FIG. 8A, the memory device 800, commonly referred to as a finFET, includes a channel 802 formed from a thin film or layer of semiconducting material overlying a surface 804 on a substrate 806 connecting a source 808 and a drain 810 of the memory device. The channel 802 is enclosed on three sides by a fin which forms a gate 812 of the device. The thickness of the gate 812 (measured in the direction from source to drain) determines the effective channel length of the device.

Figure 8B:
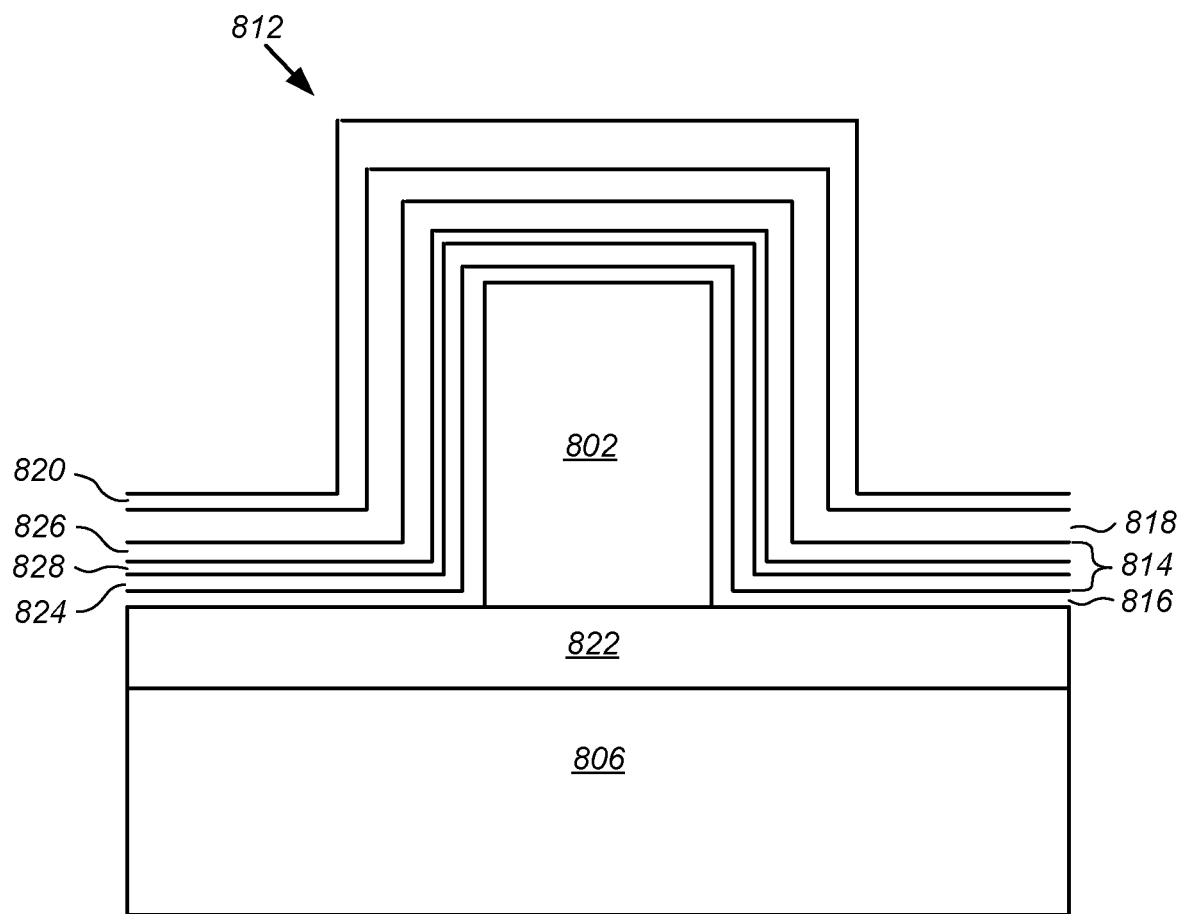
FIG. 8B illustrates a cross-sectional view of the non-planar multigate device of FIG. 8A.

In accordance with the present disclosure, the non-planar multigate memory device 800 of FIG. 8A can include a split charge-trapping region. FIG. 8B is a cross-sectional view of a portion of the non-planar memory device of FIG. 8A including a portion of the substrate 806, channel 802 and the gate 812 illustrating a multi-layer charge storing layer 814. The gate 812 further includes a tunnel oxide layer 816 overlying a raised channel 802, a blocking dielectric 818 and a metal gate layer 820 overlying the blocking layer to form a control gate of the memory device 800. In some embodiments a doped polysilicon may be deposited instead of metal to provide a polysilicon gate layer. The channel 802 and gate 812 can be formed directly on substrate 806 or on an insulating or dielectric layer 822, such as a buried oxide layer, formed on or over the substrate.

Referring to FIG. 8B, the multi-layer charge storing layer 814 includes at least one lower or bottom charge-trapping layer 824 including nitride closer to the tunnel oxide layer 816, and an upper or top charge-trapping layer 826 overlying the bottom charge-trapping layer. Generally, the top charge-trapping layer 826 includes a silicon-rich, oxygen-lean nitride layer and includes a majority of a charge traps distributed in multiple charge-trapping layers, while the bottom charge-trapping layer 824 includes an oxygen-rich nitride or silicon oxynitride, and is oxygen-rich relative to the top charge-trapping layer to reduce the number of charge traps therein. By oxygen-rich it is meant wherein a concentration of oxygen in the bottom charge-trapping layer 824 is from about 15 to about 40%, whereas a concentration of oxygen in top charge-trapping layer 826 is less than about 5%.

In one embodiment, the blocking dielectric 818 also includes an oxide, such as an HTO, to provide an ONNO structure. The channel 802 and the overlying ONNO structure can be formed directly on a silicon substrate 806 and overlaid with a doped polysilicon gate layer 820 to provide a SONNOS structure.

In some embodiments, such as that shown in FIG. 8B, the multi-layer charge storing layer 814 further includes at least one thin, intermediate or anti-tunneling layer 828 including a dielectric, such as an oxide, separating the top charge-trapping layer 826 from the bottom charge-trapping layer 824. The anti-tunneling layer 828 substantially reduces the probability of electron charge that accumulates at the boundaries of the upper nitride layer 826 during programming from tunneling into the bottom nitride layer 824, resulting in lower leakage current than for the structures illustrated in FIG. 1 and FIG. 6.

As with the embodiments described above, either or both of the bottom charge-trapping layer 824 and the top charge-trapping layer 826 can include silicon nitride or silicon oxynitride, and can be formed, for example, by a CVD process including $N_2O/NH_3$ and $DCS/NH_3$ gas mixtures in ratios and at flow rates tailored to provide a silicon-rich and oxygen-rich oxynitride layer. The second nitride layer of the multi-layer charge storing structure is then formed on the middle oxide layer. The top charge-trapping layer 826 has a stoichiometric composition of oxygen, nitrogen and/or silicon different from that of the bottom charge-trapping layer 824, and may also be formed or deposited by a CVD process using a process gas including $DCS/NH_3$ and $N_2O/NH_3$ gas mixtures in ratios and at flow rates tailored to provide a silicon-rich, oxygen-lean top nitride layer.

In those embodiments including an intermediate or anti-tunneling layer 828 including oxide, the anti-tunneling layer can be formed by oxidation of the bottom oxynitride layer, to a chosen depth using radical oxidation. Radical oxidation may be performed, for example, at a temperature of 1000-1100° C. using a single wafer tool, or 800-900° C. using a batch reactor tool. A mixture of $H_2$ and $O_2$ gasses may be employed at a pressure of 300-500 Tor for a batch process, or 10-15 Tor using a single vapor tool, for a time of 1-2 minutes using a single wafer tool, or 30 min-1 hour using a batch process.

Finally, in those embodiments including a blocking dielectric 818 including oxide the oxide may be formed or deposited by any suitable means. In one embodiment the oxide of the blocking dielectric 818 is a high temperature oxide deposited in a HTO CVD process. Alternatively, the blocking dielectric 818 or blocking oxide layer may be thermally grown, however it will be appreciated that in this embodiment the top nitride thickness may be adjusted or increased as some of the top nitride will be effectively consumed or oxidized during the process of thermally growing the blocking oxide layer. A third option is to oxidize the top nitride layer to a chosen depth using radical oxidation.

A suitable thickness for the bottom charge-trapping layer 824 may be from about 30 Å to about 80 Å (with some variance permitted, for example ±10 Å), of which about 5-20 Å may be consumed by radical oxidation to form the anti-tunneling layer 828. A suitable thickness for the top charge-trapping layer 826 may be at least 30 Å. In certain embodiments, the top charge-trapping layer 826 may be formed up to 130 Å thick, of which 30-70 Å may be consumed by radical oxidation to form the blocking dielectric 818. A ratio of thicknesses between the bottom charge-trapping layer 824 and top charge-trapping layer 826 is approximately 1:1 in some embodiments, although other ratios are also possible.

In other embodiments, either or both of the top charge-trapping layer 826 and the blocking dielectric 818 may include a high K dielectric. Suitable high K dielectrics include hafnium based materials such as HfSiON, HfSiO or HfO, Zirconium based material such as ZrSiON, ZrSiO or ZrO, and Yttrium based material such as $Y_2O_3$.

Figure 9A:
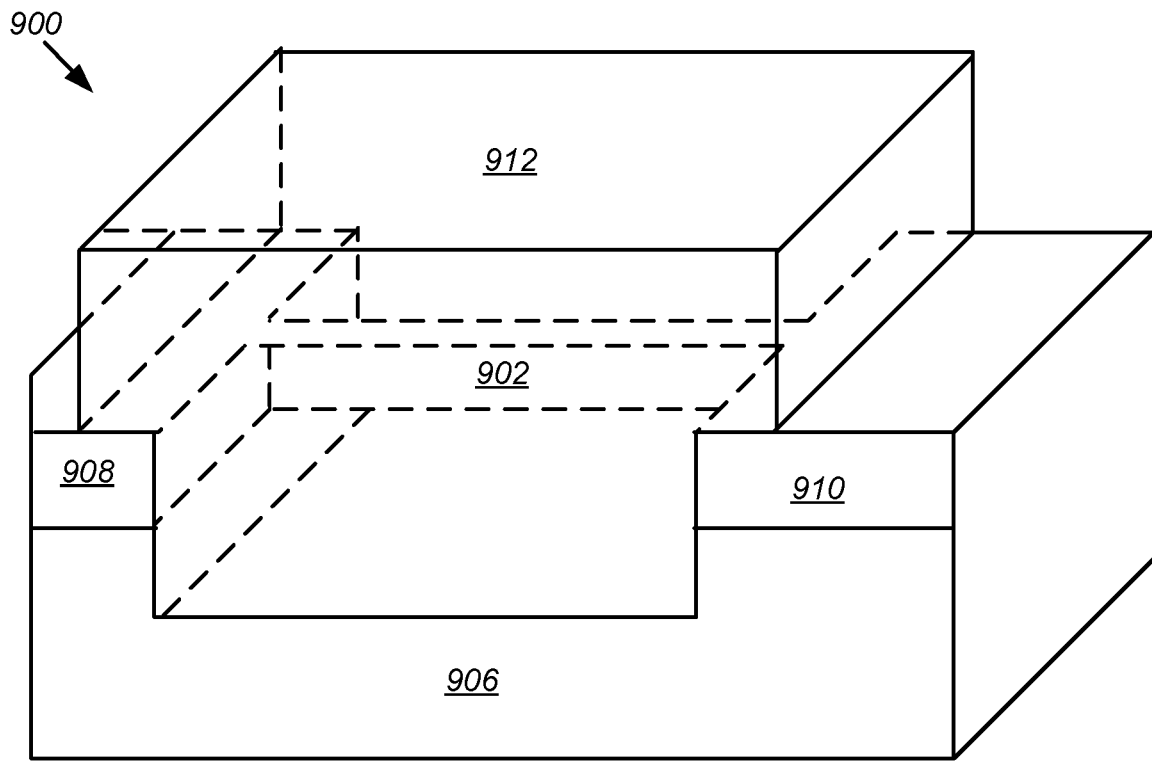
FIGS. 9A and 9B illustrate a non-planar multigate device including a split charge-trapping region and a horizontal nanowire channel.
Figure 9B:
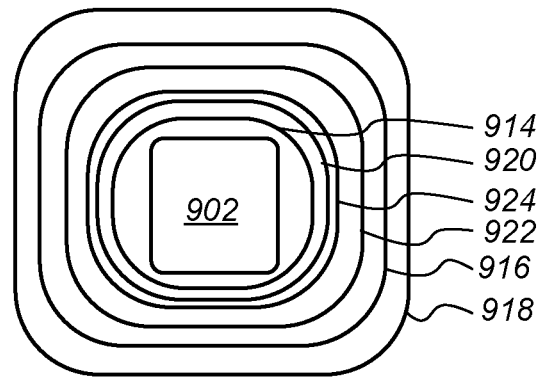

In another embodiment, shown in FIGS. 9A and 9B, the memory device can include a nanowire channel formed from a thin film of semiconducting material overlying a surface on a substrate connecting a source and a drain of the memory device. By nanowire channel it is meant a conducting channel formed in a thin strip of crystalline silicon material, having a maximum cross-sectional dimension of about 10 nanometers (nm) or less, and more preferably less than about 6 nm. Optionally, the channel can be formed to have <100> surface crystalline orientation relative to a long axis of the channel.

Referring to FIG. 9A, the memory device 900 includes a horizontal nanowire channel 902 formed from a thin film or layer of semiconducting material on or overlying a surface on a substrate 906, and connecting a source 908 and a drain 910 of the memory device. In the embodiment shown, the device has a gate-all-around (GAA) structure in which the nanowire channel 902 is enclosed on all sides by a gate 912 of the device. The thickness of the gate 912 (measured in the direction from source to drain) determines the effective channel length of the device.

In accordance with the present disclosure, the non-planar multigate memory device 900 of FIG. 9A can include a split charge-trapping region. FIG. 9B is a cross-sectional view of a portion of the non-planar memory device of FIG. 9A including a portion of the substrate 906, nanowire channel 902 and the gate 912 illustrating a split charge-trapping region. Referring to FIG. 9B, the gate 912 includes a tunnel oxide layer 914 overlying the nanowire channel 902, a split charge-trapping region, a blocking dielectric 916 and a gate layer 918 overlying the blocking layer to form a control gate of the memory device 900. The gate layer 918 can include a metal or a doped polysilicon. The multi-layer charge storing layer includes at least one inner charge-trapping layer 920 including nitride closer to the tunnel oxide layer 914, and an outer charge-trapping layer 922 overlying the inner charge-trapping layer. Generally, the outer charge-trapping layer 922 includes a silicon-rich, oxygen-lean nitride layer and includes a majority of a charge traps distributed in multiple charge-trapping layers, while the inner charge-trapping layer 920 includes an oxygen-rich nitride or silicon oxynitride, and is oxygen-rich relative to the outer charge-trapping layer to reduce the number of charge traps therein.

In some embodiments, such as that shown, the multi-layer charge storing layer further includes at least one thin, intermediate or anti-tunneling layer 924 including a dielectric, such as an oxide, separating outer charge-trapping layer 922 from the inner charge-trapping layer 920. The anti-tunneling layer 924 substantially reduces the probability of electron charge that accumulates at the boundaries of outer charge-trapping layer 922 during programming from tunneling into the inner charge-trapping layer 920, resulting in lower leakage current.

As with the embodiment described above, either or both of the inner charge-trapping layer 920 and the outer charge-trapping layer 922 can include silicon nitride or silicon oxynitride, and can be formed, for example, by a CVD process including $N_2O/NH_3$ and $DCS/NH_3$ gas mixtures in ratios and at flow rates tailored to provide a silicon-rich and oxygen-rich oxynitride layer. The second nitride layer of the multi-layer charge storing structure is then formed on the middle oxide layer. The outer charge-trapping layer 922 has a stoichiometric composition of oxygen, nitrogen and/or silicon different from that of the inner charge-trapping layer 920, and may also be formed or deposited by a CVD process using a process gas including $DCS/NH_3$ and $N_2O/NH_3$ gas mixtures in ratios and at flow rates tailored to provide a silicon-rich, oxygen-lean top nitride layer.

In those embodiments including an intermediate or anti-tunneling layer 924 including oxide, the anti-tunneling layer can be formed by oxidation of the inner charge-trapping layer 920, to a chosen depth using radical oxidation. Radical oxidation may be performed, for example, at a temperature of 1000-1100° C. using a single wafer tool, or 800-900° C. using a batch reactor tool. A mixture of $H_2$ and $O_2$ gasses may be employed at a pressure of 300-500 Tor for a batch process, or 10-15 Tor using a single vapor tool, for a time of 1-2 minutes using a single wafer tool, or 30 min −1 hour using a batch process.

Finally, in those embodiments in which the blocking dielectric 916 includes oxide, the oxide may be formed or deposited by any suitable means. In one embodiment the oxide of blocking dielectric 916 is a high temperature oxide deposited in a HTO CVD process. Alternatively, the blocking dielectric 916 or blocking oxide layer may be thermally grown, however it will be appreciated that in this embodiment the thickness of the outer charge-trapping layer 922 may need to be adjusted or increased as some of the top nitride will be effectively consumed or oxidized during the process of thermally growing the blocking oxide layer.

A suitable thickness for the inner charge-trapping layer 920 may be from about 30 Å to about 80 Å (with some variance permitted, for example ±10 A), of which about 5-20 Å may be consumed by radical oxidation to form the anti-tunneling layer 924. A suitable thickness for the outer charge-trapping layer 922 may be at least 30 Å. In certain embodiments, the outer charge-trapping layer 922 may be formed up to 120 Å thick, of which 30-70 Å may be consumed by radical oxidation to form the blocking dielectric 916. A ratio of thicknesses between the inner charge-trapping layer 920 and the outer charge-trapping layer 922 is approximately 1:1 in some embodiments, although other ratios are also possible.

In other embodiments, either or both of the outer charge-trapping layer 922 and the blocking dielectric 916 may include a high K dielectric. Suitable high K dielectrics include hafnium based materials such as HfSiON, HfSiO or HfO, Zirconium based material such as ZrSiON, ZrSiO or ZrO, and Yttrium based material such as $Y_2O_3$.

In another embodiment, the memory device is or includes a non-planar device including a vertical nanowire channel formed in or from a semiconducting material projecting above or from a number of conducting, semiconducting layers on a substrate. In one version of this embodiment, shown in cut-away in FIG. 10A, the memory device 1000 includes a vertical nanowire channel 1002 formed in a cylinder of semiconducting material connecting a source 1004 and drain 1006 of the device. The channel 1002 is surrounded by a tunnel oxide layer 1008, a multi-layer charge storing layer 1110, a blocking layer 1012 and a gate layer 1014 overlying the blocking layer to form a control gate of the memory device 1000. The channel 1002 can include an annular region in an outer layer of a substantially solid cylinder of semiconducting material, or can include an annular layer formed over a cylinder of dielectric filler material. As with the horizontal nanowires described above, the channel 1002 can include polysilicon or recrystallized polysilicon to form a monocrystalline channel. Optionally, where the channel 1002 includes a crystalline silicon, the channel can be formed to have <100> surface crystalline orientation relative to a long axis of the channel.

Figure 10A:
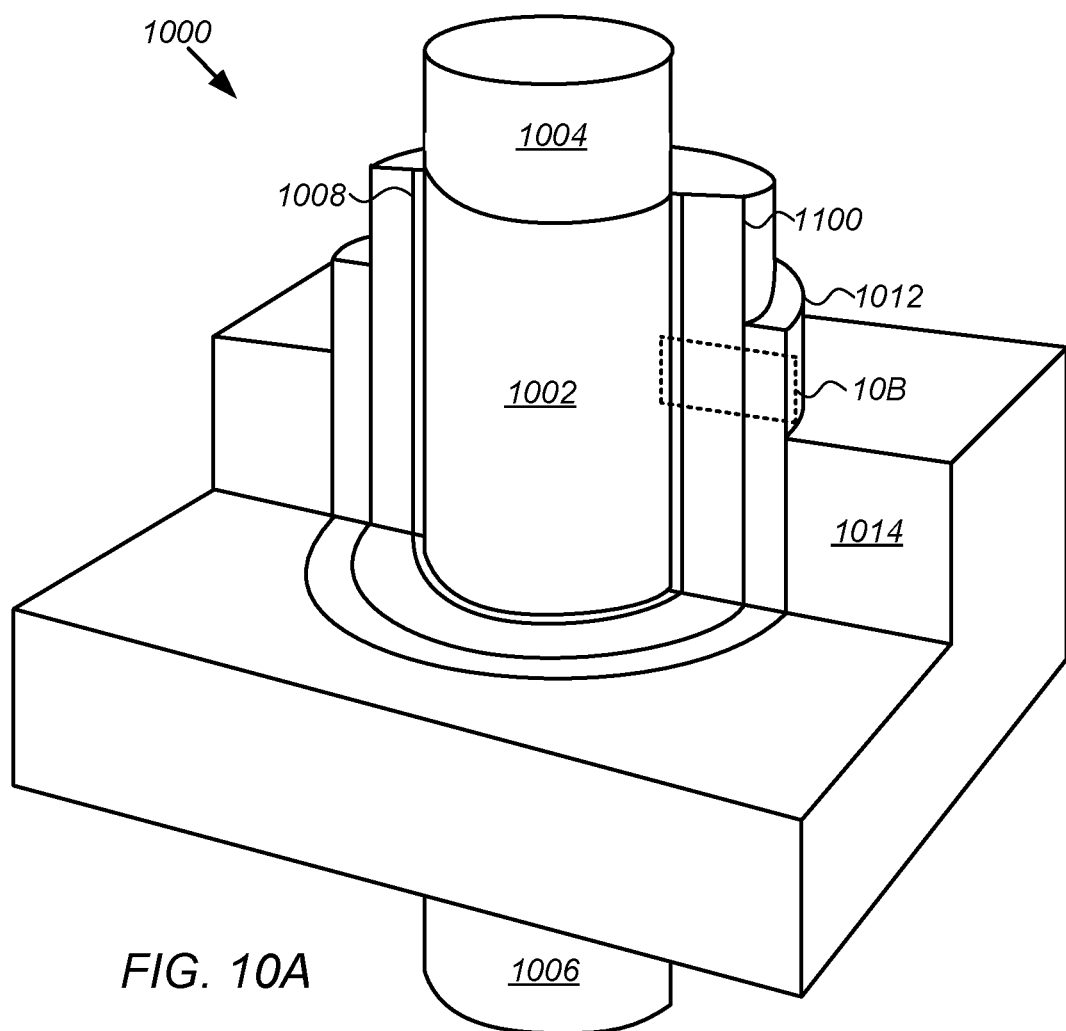
FIGS. 10A and 10B illustrate a non-planar multigate device including a split charge-trapping region and a vertical nanowire channel.
Figure 10B:
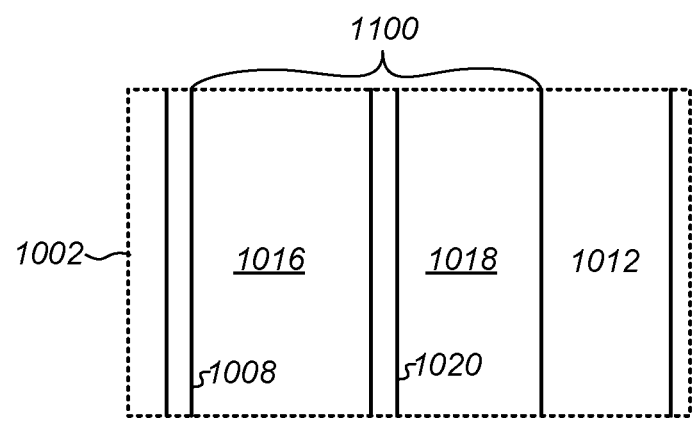

In some embodiments, such as that shown in FIG. 10B, the multi-layer charge storing layer 1010 can be a multi-layer charge storing layer including at least a first or inner charge trapping layer 1016 closest to the tunnel oxide layer 1008, and a second or outer charge trapping layer 1018. Optionally, the first and second charge trapping layers can be separated by an intermediate oxide or anti-tunneling layer 1020.

As with the embodiments described above, either or both of the first charge trapping layer 1016 and the second charge trapping layer 1018 can include silicon nitride or silicon oxynitride, and can be formed, for example, by a CVD process including $N_2O/NH_3$ and $DCS/NH_3$ gas mixtures in ratios and at flow rates tailored to provide a silicon-rich and oxygen-rich oxynitride layer.

Finally, either or both of the second charge trapping layer 1018 and the blocking layer 1012 may include a high K dielectric, such as HfSiON, HfSiO, HfO, ZrSiON, ZrSiO, ZrO, or $Y_2O_3$.

A suitable thickness for the first charge trapping layer 1016 may be from about 30 Å to about 80 Å (with some variance permitted, for example ±10 A), of which about 5-20 Å may be consumed by radical oxidation to form the anti-tunneling layer 1020. A suitable thickness for the second charge trapping layer 1018 may be at least 30 Å, and a suitable thickness for the blocking dielectric 1012 may be from about 30-70 Å.

The memory device 1000 of FIG. 10A can be made using either a gate first or a gate last scheme. FIG. 11A-F illustrate a gate first scheme for fabricating the non-planar multigate device of FIG. 10A. FIG. 12A-F illustrate a gate last scheme for fabricating the non-planar multigate device of FIG. 10A.

Figure 11A:
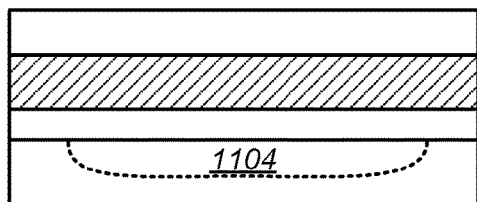
FIG. 11A through 11F illustrate a gate first scheme for fabricating the non-planar multigate device of FIG. 10A.

Referring to FIG. 11A, in a gate first scheme a first or lower dielectric layer 1102, such as a blocking oxide, is formed over a first, doped diffusion region 1104, such as a source or a drain, in a substrate 1106. A gate layer 1108 is deposited over the first dielectric layer 1102 to form a control gate of the device, and a second or upper dielectric layer 1110 formed thereover. As with embodiments described above, the first and second dielectric layers 1102, 1110, can be deposited by CVD, radical oxidation or be formed by oxidation of a portion of the underlying layer or substrate. The gate layer 1108 can include a metal deposited or a doped polysilicon deposited by CVD. Generally the thickness of the gate layer 1108 is from about 40-50 Å, and the first and second dielectric layers 1102, 1110, from about 20-80 Å.

Figure 11B:
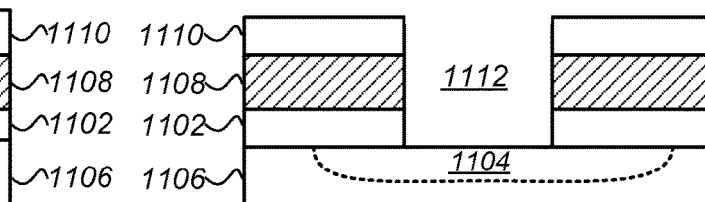
Figure 11C:
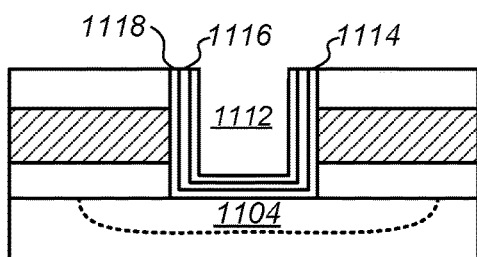

Referring to FIG. 11B, a first opening 1112 is etched through the overlying gate layer 1108, and the first and second dielectric layers 1102, 1110, to the diffusion region 1104 in the substrate 1106. Next, layers including a tunnel oxide layer 1114, multi-layer charge storing layer 1116, and blocking dielectric 1118 are sequentially deposited in the opening and the surface of the upper dielectric layer 1110 planarize to yield the intermediate structure shown in FIG. 11C.

Although not shown, it will be understood that as in the embodiments described above the multi-layer charge storing layer 1116 can include a multi-layer charge storing layer including at least one lower or bottom charge-trapping layer closer to the tunnel oxide layer 1114, and an upper or top charge-trapping layer overlying the bottom charge-trapping layer. Generally, the top charge-trapping layer includes a silicon-rich, oxygen-lean nitride layer and includes a majority of a charge traps distributed in multiple charge-trapping layers, while the bottom charge-trapping layer includes an oxygen-rich nitride or silicon oxynitride, and is oxygen-rich relative to the top charge-trapping layer to reduce the number of charge traps therein. In some embodiments, the multi-layer charge storing layer 1116 further includes at least one thin, intermediate or anti-tunneling layer including a dielectric, such as an oxide, separating the top charge-trapping layer from the bottom charge-trapping layer.

Figure 11D:
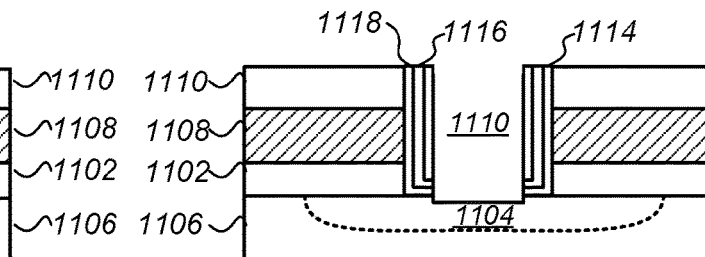
Figure 11E:
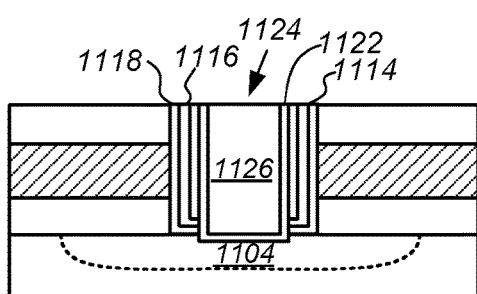

Next, a second or channel opening 1120 is anisotropically etched through tunnel oxide layer 1114, multi-layer charge storing layer 1116, and blocking dielectric 1118, FIG. 11D. Referring to FIG. 11E, a semiconducting material 1122 is deposited in the channel opening to form a vertical channel 1124 therein. The vertical channel 1124 can include an annular region in an outer layer of a substantially solid cylinder of semiconducting material, or, as shown in FIG. 11E, can include a separate, layer semiconducting material 1122 surrounding a cylinder of dielectric filler material 1126.

Figure 11F:
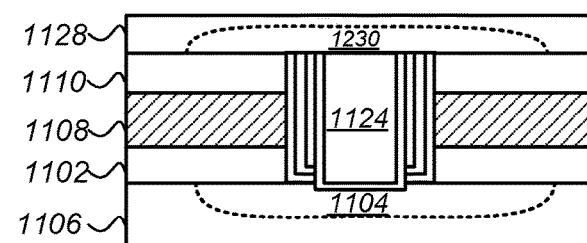

Referring to FIG. 11F, the surface of the upper dielectric layer 1110 is planarized and a layer of semiconducting material 1128 including a second, doped diffusion region 1130, such as a source or a drain, formed therein deposited over the upper dielectric layer to form the device shown.

Figure 12A:
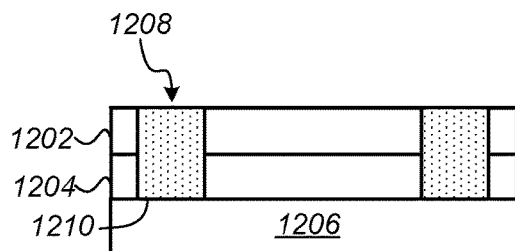
FIG. 12A through 12F illustrate a gate last scheme for fabricating the non-planar multigate device of FIG. 10A.

Referring to FIG. 12A, in a gate last scheme a dielectric layer 1202, such as an oxide, is formed over a sacrificial layer 1204 on a surface on a substrate 1206, an opening etched through the dielectric and sacrificial layers and a vertical channel 1208 formed therein. As with embodiments described above, the vertical channel 1208 can include an annular region in an outer layer of a substantially solid cylinder of semiconducting material 1210, such as polycrystalline or monocrystalline silicon, or can include a separate, layer semiconducting material surrounding a cylinder of dielectric filler material (not shown). The dielectric layer 1202 can include any suitable dielectric material, such as a silicon oxide, capable of electrically isolating the subsequently formed gate layer of the memory device 1000 from an overlying electrically active layer or another memory device. The sacrificial layer 1204 can include any suitable material that can be etched or removed with high selectivity relative to the material of the dielectric layer 1202, substrate 1206 and vertical channel 1208.

Figure 12B:
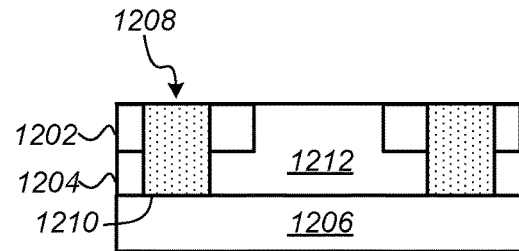

Referring to FIG. 12B, a second opening 1212 is etched through the etched through the dielectric and sacrificial layers 1202, 1204, to the substrate 1206, and the sacrificial layer 1204 etched or removed. The sacrificial layer 1204 can include any suitable material that can be etched or removed with high selectivity relative to the material of the dielectric layer 1202, substrate 1206 and vertical channel 1208. In one embodiment the sacrificial layer 1204 includes silicon dioxide that can be removed by buffered oxide etch (BOE etch).

Figure 12C:
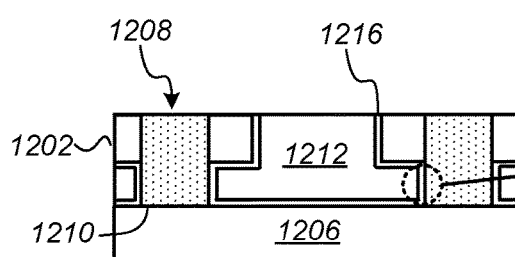
Figure 12D:
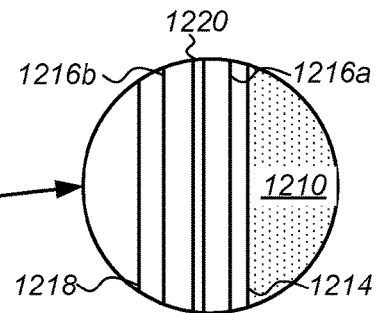

Referring to FIGS. 12C and 12D, layers of a tunnel oxide layer 1214, multi-layer charge storing layer 1216, and blocking dielectric 1218 are sequentially deposited in the opening and the surface of the dielectric layer 1202 planarize to yield the intermediate structure shown in FIGS. 12C and 12D. In some embodiments, such as that shown in FIG. 12D, the multi-layer charge storing layer 1216 can be a multi-layer charge storing layer including at least a first or inner charge trapping layer 1216a closest to the tunnel oxide layer 1214, and a second or outer charge trapping layer 1216b. Optionally, the first and second charge trapping layers can be separated by an intermediate oxide or anti-tunneling layer 1220.

Figure 12E:
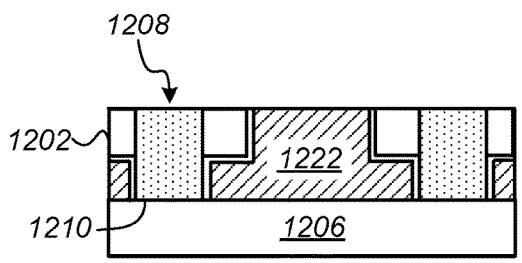
Figure 12F:
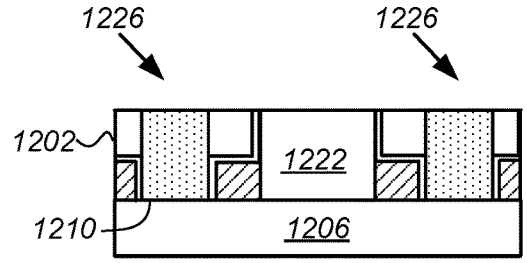

Next, a gate layer 1222 is deposited into the second opening 1212 and the surface of the upper dielectric layer 1202 planarized to yield the intermediate structure illustrated in FIG. 12E. As with embodiments described above, the gate layer 1222 can include a metal deposited or a doped polysilicon. Finally, an opening 1224 is etched through the gate layer 1222 to form control gate of separate memory devices 1226 as illustrated in FIG. 12F.

Embodiments of the charge retention devices described herein may be employed in logic circuits to function as machine-memory. Those having skill in the art will appreciate that there are various logic implementations that may embody the described structures, and that the preferred vehicle will vary with the context in which the processes are deployed. For example, if an implementer determines that speed and accuracy are paramount, the implementer may opt for a hardware and/or firmware vehicle; alternatively, if flexibility is paramount, the implementer may opt for a solely software implementation; or, yet again alternatively, the implementer may opt for some combination of hardware, software, and/or firmware. Hence, there are many vehicles that may employ the devices described herein, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations may involve optically-oriented hardware, software, and or firmware.

Although shown and described above as having only two oxynitride layer, i.e., a top and a bottom layer, the present disclosure is not so limited, and the multi-layer charge storing layer can include any number, n, of oxynitride layers, any or all of which may have differing stoichiometric compositions of oxygen, nitrogen and/or silicon. In particular, multi-layer charge storing layers having up to five oxynitride layers each with differing stoichiometric compositions have been produced and tested. However, as will be appreciated by those skilled in the art it is generally desirable to utilize as few layers as possible to accomplish a desired result, reducing the process steps necessary to produce the device, and thereby providing a much simpler and more robust manufacturing process. Moreover, utilizing as few layers as possible also results in higher yields as it is simpler to control the stoichiometric composition and dimensions of the fewer layers.

It will further be appreciated that although shown and described as part of a silicon-oxide-oxynitride-oxide-silicon stack in a memory device, the structure and method of the present disclosure is not so limited, and the silicon-oxide-oxynitride-oxide-silicon structure can be used in or with any semiconductor technology or in any device requiring a charge storing or dielectric layer or stack including, for example, in a split gate flash memory, a TaNOS stack, in a 1T (transistor) SONOS-type cell, a 2T SONOS-type cell, a 3T SONOS-type cell, a localized 2-bit cell, a multilevel programming or cell, and/or a 9T or 12T non-volatile semiconductor memory (NVSM) cells without departing from the scope of the disclosure.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood as notorious by those within the art that each function and/or operation within such block diagrams, flowcharts, or examples can be implemented, individually and/or collectively, by a wide range of hardware, software, firmware, or virtually any combination thereof Embodiments of the structures described herein may be employed in Application Specific Integrated Circuits (ASICs), Field Programmable Gate Arrays (FPGAs), central processing units (CPUs), digital signal processors (DSPs), or other integrated formats. However, those skilled in the art will recognize that some aspects of the embodiments disclosed herein, in whole or in part, can be equivalently implemented in dedicated memory circuits, for the purpose of storing digital information for data and/or programs running on one or more computers (e.g., as one or more programs running on one or more computer systems), as one or more programs running on one or more processors (e.g., as one or more programs running on one or more microprocessors), as firmware, or as virtually any combination thereof In a general sense, those skilled in the art will recognize that the various structures described herein may be embodied, individually and/or collectively, by a wide range of electrical circuitry. As used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment).

Those skilled in the art will recognize that it is common within the art to describe devices and/or processes in the fashion set forth herein, and thereafter use standard engineering practices to integrate such described devices and/or processes into larger systems. That is, at least a portion of the devices and/or processes described herein can be integrated into a network processing system without an undue amount of experimentation.

What is claimed is:

1. A method of fabricating a semiconductor device over a semiconductor structure, comprising:
    forming a channel;
    forming a tunnel oxide layer adjacent to the channel, and a blocking oxide layer;
    forming a multi-layer charge storing layer between the tunnel oxide and blocking oxide layers, further comprising;
        forming a first charge storing layer adjacent to the tunnel oxide layer, the first charge storing layer comprising an oxygen-rich silicon-rich oxynitride layer, a stoichiometric composition of the oxygen-rich silicon-rich oxynitride layer resulting in the first charge storing layer having a low charge trap density; and
        forming a second charge storing layer directly on the first charge storing layer and adjacent to the blocking oxide layer, the second charge storing layer comprising an oxygen-lean oxynitride layer, a stoichiometric composition of the oxygen-lean oxynitride layer resulting in the second charge storing layer having a high charge trap density, wherein the charge density of the second charge storing layer is at least 1000 times greater than the charge trap density of the first charge storing layer; and
    forming a silicon containing gate layer on the blocking oxide layer.

2. The method of claim 1, wherein the stoichiometric composition of the first charge storing layer comprises a concentration of oxygen selected to increase a retention performance of the multi-layer charge storing layer by acting as a barrier between charge trapped in the second charge storing layer and the channel.

3. The method of claim 2, wherein the concentration of oxygen in the first charge storing layer is about 15% to about 40%.

4. The method of claim 1, the second charge storing layer further comprises a concentration of carbon selected to increase the charge density.

5. The method of claim 1, wherein a concentration of oxygen in the second charge storing layer is less than about 5%.

6. The method of claim 2, wherein the retention performance of the multi-layer charge storing layer increases an end-of-life (EOL) for the semiconductor device at a specified difference between program and erase voltages to at least about 20 years.

7. The method of claim 1, wherein the first charge storing layer is formed in a chemical vapor deposition (CVD) process using a process gas comprising a dichlorosilane ($SiH_2Cl_2$)/ammonia ($NH_3$) mixture at a ratio in a range of about 5:1 to 15:1 and a nitrous oxide ($N_2O$)/$NH_3$ mixture at a ratio in a range of about 2:1 to 4:1, and wherein the second charge storing layer is formed in a CVD process using a process gas comprising a $N_2O$/$NH_3$ mixture at a ratio in a range of about 1:6 to 1:8 and a $SiH_2Cl_2$/$NH_3$ mixture at a ratio in a range of about 1.5:1 to 3:1.

8. The method of claim 7, wherein forming the first charge storing layer and the second charge storing layer are performed sequentially in a single CVD tool by changing the ratio of the $N_2O$/$NH_3$ and $SiH_2Cl_2$/$NH_3$ mixtures.

9. The method of claim 1, wherein the tunnel oxide layer is grown in an In-Situ Steam Generation (ISSG) chamber with a radical oxidation using a reaction between oxygen ($O_2$) and hydrogen ($H_2$) on the substrate at temperatures of at least 1000° C.

10. The method of claim 1, wherein the blocking oxide layer is formed by high density plasma (HDP) oxidation of a portion of the second charge storing layer.

11. The method of claim 1, wherein the second charge storing layer is formed in a CVD process using a process gas comprising Bis-TertiaryButylAminoSilane (BTBAS) and ammonia ($NH_3$) mixed at a ratio of from about 7:1 to about 1:7.

12. A multi-layer charge storing layer comprising:
    a first charge storing layer comprising an oxygen-rich oxynitride in which a stoichiometric composition of the oxygen-rich oxynitride results in the first charge storing layer being substantially trap free; and
    a second charge storing layer directly on the first charge storing layer comprising an oxygen-lean, silicon-rich and nitrogen-rich oxynitride in which a stoichiometric composition of the oxygen-lean, silicon-rich and nitrogen-rich oxynitride layer results in the second charge storing layer being trap dense;
    wherein a charge trap density of the second charge storing layer is at least 1000 times greater than a charge trap density of the first charge storing layer.

13. The multi-layer charge storing layer of claim 12, wherein the second charge storing layer further comprises a concentration of carbon selected to increase a number of charge traps therein.

14. The multi-layer charge storing layer of claim 12, wherein the first charge storing layer comprises a homogeneous composition.

15. The multi-layer charge storing layer of claim 13, wherein the second charge storing layer comprises a concentration of carbon of from about 5% to about 15%.

16. The multi-layer charge storing layer of claim 12, wherein a concentration of oxygen in the first charge storing layer is from about 15% to about 40%.

17. The multi-layer charge storing layer of claim 16, wherein a concentration of oxygen in the second charge storing layer is less than about 5%.

18. The multi-layer charge storing layer of claim 12, wherein the multi-layer charge storing layer is disposed between a tunnel dielectric layer adjacent to the first charge storing layer and a blocking dielectric layer adjacent to the second charge storing layer.

19. The multi-layer charge storing layer of claim 12, further comprising at least one additional charge storing layer disposed between the first and second charge storing layers, wherein the first, the second, and the at least one additional charge storing layers have differing stoichiometric compositions of oxygen, nitrogen, and silicon.

20. The multi-layer charge storing layer of claim 16, wherein the concentration of oxygen in the first charge storing layer is selected to increase a retention performance of the multi-layer charge storing layer by acting as a barrier between charge trapped in the second charge storing layer and a channel.

* * * * *